United States Patent
Zhu et al.

(10) Patent No.: US 11,728,477 B2
(45) Date of Patent: Aug. 15, 2023

(54) MANUFACTURING APPARATUS AND METHOD FOR MAKING SILICON NANOWIRES ON CARBON BASED POWDERS FOR USE IN BATTERIES

(71) Applicant: OneD Material LLC, Palo Alto, CA (US)

(72) Inventors: Yimin Zhu, Union City, CA (US); Vincent Pluvinage, Atherton, CA (US)

(73) Assignee: OneD Material, Inc., Palo Alto, CA (US)

( * ) Notice: Subject to any disclaimer, the term of this patent is extended or adjusted under 35 U.S.C. 154(b) by 0 days.

(21) Appl. No.: 15/650,797

(22) Filed: Jul. 14, 2017

(65) Prior Publication Data
US 2018/0019468 A1 Jan. 18, 2018

Related U.S. Application Data

(60) Provisional application No. 62/363,087, filed on Jul. 15, 2016.

(51) Int. Cl.
*H01M 4/38* (2006.01)
*H01M 10/0525* (2010.01)
*H01M 4/1395* (2010.01)
*H01M 4/134* (2010.01)
*H01M 4/04* (2006.01)
(Continued)

(52) U.S. Cl.
CPC ............ *H01M 4/382* (2013.01); *C22C 38/02* (2013.01); *C23C 16/24* (2013.01); *H01M 4/0416* (2013.01); *H01M 4/134* (2013.01); *H01M 4/1395* (2013.01); *H01M 4/366* (2013.01);
(Continued)

(58) Field of Classification Search
None
See application file for complete search history.

(56) References Cited

U.S. PATENT DOCUMENTS 3,395,674 A * 8/1968 Burham .................. H01B 1/00
                                                          118/716
4,136,216 A    1/1979 Feldstein
(Continued)

FOREIGN PATENT DOCUMENTS

CN    1424149 A    6/2003
CN    1490439 A    4/2004
(Continued)

OTHER PUBLICATIONS

Suzuki et al., Formation of Silicon Nonowires by CVD Using Gold Catalysts at Low Temperatures, Published Jul. 19, 2007, Materials Transactions, vol. 48, No. 8, (2007).
(Continued)

*Primary Examiner* — Parviz Hassanzadeh
*Assistant Examiner* — Tiffany Z Nuckols
(74) *Attorney, Agent, or Firm* — Jennifer Hayes; Nixon Peabody LLP

(57) ABSTRACT

Manufacturing apparatus, systems and method of making silicon (Si) nanowires on carbon based powders, such as graphite, that may be used as anodes in lithium ion batteries are provided. In some embodiments, an inventive tumbler reactor and chemical vapor deposition (CVD) system and method for growing silicon nanowires on carbon based powders in scaled up quantities to provide production scale anodes for the battery industry are described.

18 Claims, 9 Drawing Sheets

(51) Int. Cl.
*H01M 10/0565* (2010.01)
*C22C 38/02* (2006.01)
*H01M 4/36* (2006.01)
*C23C 16/24* (2006.01)

(52) U.S. Cl.
CPC ....... *H01M 4/386* (2013.01); *H01M 10/0565* (2013.01); *H01M 10/0525* (2013.01)

(56) References Cited

U.S. PATENT DOCUMENTS

| | | | |
|---|---|---|---|
| 4,171,225 A | 10/1979 | Molenaar et al. | |
| 4,400,436 A | 8/1983 | Breininger et al. | |
| 5,677,082 A | 10/1997 | Greinke et al. | |
| 5,897,945 A | 4/1999 | Lieber et al. | |
| 5,997,832 A | 12/1999 | Lieber et al. | |
| 6,036,774 A | 3/2000 | Lieber et al. | |
| 6,225,198 B1 | 5/2001 | Alivisatos et al. | |
| 6,303,266 B1 | 10/2001 | Okino et al. | |
| 6,306,736 B1 | 10/2001 | Alivisatos et al. | |
| 6,326,056 B1 * | 12/2001 | Yira | C23C 14/223 |
| | | | 427/248.1 |
| 6,479,030 B1 | 11/2002 | Firsich | |
| 6,709,520 B1 * | 3/2004 | Leycuras | C30B 11/00 |
| | | | 118/715 |
| 6,872,260 B2 * | 3/2005 | Nishiuchi | C23C 14/505 |
| | | | 118/716 |
| 6,962,823 B2 | 11/2005 | Empedocles et al. | |
| 7,067,867 B2 | 6/2006 | Duan et al. | |
| 7,105,428 B2 | 9/2006 | Pan et al. | |
| 7,211,464 B2 | 5/2007 | Lieber et al. | |
| 7,301,199 B2 | 11/2007 | Lieber et al. | |
| 7,569,941 B2 | 8/2009 | Majumdar et al. | |
| 7,776,760 B2 | 8/2010 | Taylor | |
| 7,825,036 B2 | 11/2010 | Yao et al. | |
| 7,842,432 B2 | 11/2010 | Niu et al. | |
| 7,951,422 B2 | 5/2011 | Pan et al. | |
| 8,623,288 B1 | 1/2014 | Dubrow et al. | |
| 9,764,954 B2 * | 9/2017 | Walters | C09C 1/44 |
| 10,243,207 B2 | 3/2019 | Cao et al. | |
| 10,862,114 B2 * | 12/2020 | Zhu | H01M 4/382 |
| 11,174,552 B2 * | 11/2021 | Neikirk | B01J 4/007 |
| 2002/0168480 A1 * | 11/2002 | Yoon | B05D 1/62 |
| | | | 427/569 |
| 2004/0026684 A1 | 2/2004 | Empedocles | |
| 2004/0037767 A1 * | 2/2004 | Adderton | B82Y 30/00 |
| | | | 423/447.3 |
| 2004/0126299 A1 * | 7/2004 | Ovrebø et al. | C01B 21/06 |
| | | | 423/297 |
| 2004/0245088 A1 * | 12/2004 | Gardner | B01J 19/087 |
| | | | 204/173 |
| 2006/0188774 A1 | 8/2006 | Niu et al. | |
| 2007/0025906 A1 * | 2/2007 | Pirard | B01J 8/003 |
| | | | 423/447.3 |
| 2007/0051927 A1 | 3/2007 | Itoh et al. | |
| 2007/0166899 A1 | 7/2007 | Yao et al. | |
| 2008/0011125 A1 | 1/2008 | Shirata et al. | |
| 2008/0038520 A1 | 2/2008 | Pan et al. | |
| 2008/0135089 A1 | 6/2008 | Tsakalakos et al. | |
| 2008/0152554 A1 * | 6/2008 | Kim | B01J 6/00 |
| | | | 422/187 |
| 2008/0312070 A1 | 12/2008 | Talbot et al. | |
| 2009/0047204 A1 * | 2/2009 | Kim | C01B 33/027 |
| | | | 423/349 |
| 2009/0143227 A1 | 6/2009 | Dubrow et al. | |
| 2009/0186276 A1 | 7/2009 | Zhamu et al. | |
| 2010/0273316 A1 | 10/2010 | Renard et al. | |
| 2010/0297502 A1 | 11/2010 | Zhu et al. | |
| 2011/0008707 A1 | 1/2011 | Muraoka et al. | |
| 2011/0039690 A1 | 2/2011 | Niu | |
| 2011/0067228 A1 | 3/2011 | Green | |
| 2011/0142726 A1 * | 6/2011 | Sugiyama | B82Y 30/00 |
| | | | 422/198 |
| 2011/0200873 A1 | 8/2011 | Hu et al. | |
| 2011/0308463 A1 | 12/2011 | He et al. | |
| 2012/0003397 A1 | 1/2012 | Reniers et al. | |
| 2012/0145041 A1 * | 6/2012 | Walters | B01J 19/088 |
| | | | 106/472 |
| 2013/0199339 A1 | 8/2013 | Li et al. | |
| 2014/0154564 A1 | 6/2014 | Yoo et al. | |
| 2015/0086871 A1 | 3/2015 | Cao et al. | |
| 2015/0329360 A1 | 11/2015 | Li | |
| 2016/0141599 A1 * | 5/2016 | Takahashi | H01M 4/366 |
| | | | 429/231.8 |
| 2017/0137940 A1 * | 5/2017 | Zeberoff | C23C 16/4412 |
| 2018/0019467 A1 * | 1/2018 | Zhu | C23C 16/4417 |
| 2019/0214641 A1 | 7/2019 | Cao et al. | |
| 2019/0376181 A1 * | 12/2019 | Neikirk | B01J 3/02 |
| 2022/0064794 A1 * | 3/2022 | Neikirk | B01J 3/02 |

FOREIGN PATENT DOCUMENTS

| | | |
|---|---|---|
| CN | 101000867 A | 7/2007 |
| CN | 100448798 A | 1/2009 |
| CN | 101604753 A | 12/2009 |
| CN | 101790805 A | 7/2010 |
| CN | 101791538 A | 8/2010 |
| CN | 102460782 A | 5/2012 |
| CN | 102530931 A | 7/2012 |
| CN | 103035915 A | 4/2013 |
| CN | 103764544 A | 4/2014 |
| CN | 104025348 A | 9/2014 |
| CN | 105603392 A | 5/2016 |
| CN | 108452790 A | 8/2018 |
| CN | 109689567 A | 4/2019 |
| EP | 2378597 | 10/2011 |
| EP | 2736837 A2 | 6/2014 |
| EP | 3484810 A2 | 5/2019 |
| EP | 3778471 A1 | 2/2021 |
| EP | 2736837 B1 | 9/2021 |
| EP | 3978426 A1 | 4/2022 |
| JP | S58136701 A | 8/1983 |
| JP | S6053775 A | 3/1985 |
| JP | S5268886 A | 6/1997 |
| JP | 2002060943 A | 2/2002 |
| JP | 200313229 A | 1/2003 |
| JP | 2004349368 A | 12/2004 |
| JP | 2007186416 | 7/2007 |
| JP | 2008523565 | 7/2008 |
| JP | 2010-260170 | 11/2010 |
| JP | 2014-532023 A | 12/2014 |
| JP | 2015524149 A | 8/2015 |
| JP | 2016100086 A | 5/2016 |
| JP | 6142362 | 5/2017 |
| JP | 2017-137239 A | 8/2017 |
| JP | 6345834 | 6/2018 |
| JP | 2019527187 A | 9/2019 |
| JP | 7155104 B2 | 10/2022 |
| KR | 100778011 B1 | 11/2007 |
| KR | 20080044181 A | 5/2008 |
| KR | 101073853 B1 | 10/2011 |
| KR | 10-1128928 B1 | 3/2012 |
| KR | 10-2014-0068033 A | 6/2014 |
| KR | 20160035824 A | 4/2016 |
| KR | 10-1895386 | 8/2018 |
| KR | 20190030723 A | 3/2019 |
| KR | 10-2051770 | 11/2019 |
| WO | WO-2006062947 A2 | 6/2006 |
| WO | 2006138671 A2 | 12/2006 |
| WO | WO-2007061945 A2 | 5/2007 |
| WO | 2010129910 A2 | 11/2010 |
| WO | 2011060024 A2 | 5/2011 |
| WO | 2013016339 A2 | 1/2013 |
| WO | 2018-013991 A2 | 1/2018 |

OTHER PUBLICATIONS

Chinese Notice of Reexamination in Chinese Application No. 201280041299.4, dated Mar. 29, 2017.

Chinese Office Action (with English language translation) directed to related Chinese Application No. 201280041299.4, dated Feb. 27, 2015.

(56) References Cited

OTHER PUBLICATIONS

Chinese Office Action in Chinese Application No. 201280041299.4, dated Aug. 1, 2016.
Chinese Office Action in Chinese Application No. 201280041299.4, dated Nov. 27, 2015.
International Preliminary Report on Patentability in PCT Application No. PCT/US2012/047979, dated Jan. 28, 2014.
International Search Report directed to related international application No. PCT/US2012/047979, dated Feb. 28, 2013.
Japanese Certificate of Patent 6142362 (for JP Patent Application No. 2014-522942) dated May 19, 2017.
Japanese Office Action in Japanese Application No. 2014-522942, dated Aug. 9, 2016.
Korean Office Action in Korean Application No. 10-2014-7004916, dated Nov. 1, 2017.
Written Opinion of the International Search Authority directed to related international application No. PCT/US2012/047979, dated Feb. 28, 2013.
Bindra et al. "Fundamental Aspects of Electroless Copper Plating" Electroless Plating: Fundamentals and Applications (1990) pp. 289-329, American Electroplaters and Surface Finishers Society.
Bjork et al., "One-dimensional Steeplechase for Electrons Realized", Nano Letters, 2002, vol. 2, No. 2, pp. 87-89, American Chemical Society.
Cao, Y. et al. "Growth and properties of semiconductor core/shell nanocrystals with InAs cores" J. Am. Chem. Soc. (2000) 122:9692-9702.
Capaccio "Wastewater Treatment for Electroless Plating" (1990) pp. 519-528, American Electroplaters and Surface Finishers Society.
Chan et al. "Solution-Grown Silicon Nanowires for Lithium-Ion Battery Anodes" ACS Nano (2010) 4(3):1443-1450, American Chemical Society.
Chan, C. K., et al., "High-performance lithium battery anodes using silicon nanowires", nature nanotechnology, vol. 3, Jan. 2008, pp. 31-35; 2008 Nature Publishing Group, Published online: Dec. 16, 2007.
Chen et al. "Hybrid Silicon-Carbon Nanostructured Composites as Superior Anodes for Lithium Ion Batteries" Nano Research (2011) 4(3):290-296, Tsinghua University Press.
Chen, H. et al. "Electroless Plating Copper on Carbon Nanotubes by One-Step Activation" Nanosci & Nanotech (2009) 6(4):42-50 (w/English language Abstract).
Chen, H. et al. "Silicon Nanowires With and Without Carbon Coating as Anode Matterials for Lithium-Ion Batteries," J Solid State Electrochem (Jan. 28, 2010) 14:1829-1834.
Cui, Li-Feng, et al. "Carbon-silicon core-shell nanowires as high capacity electrode for lithium ion batteries" Nano Lett (2009) 9(9):3370-3374.
Cui, Li-Feng, et al. "Crystalline-Amorphous Core-Shell Silicon Nanowires for high Capacity and High Current Battery Electrodes" Nano Lett (2009) 9(1):491-495.
Cui, Y. et al. "Diameter-controlled synthesis of single-crystal silicon nanowires" Appl. Phys. Lett (2001) 78(15):2214-2216.
Cui, Y. et al. "Doping and electrical transport in silicon nanowires" J. Phys. Chem. B (2000) 104:5213-5216.
Dabbousi, B.O. et al., "(CdSe)ZnS core-shell quantum dots: Synthesis and characterization of a size series of highly luminescent nanocrystallites" J. Phys. Chem. B (1997) 101:9463-9475.
Duan, X. et al. "General synthesis of compound semiconductor nanowires" Adv. Mater. (2000) 12:298-302.
Gudiksen, M.S. et al., "Diameter-selective synthesis of semiconductor nanowires" J. Am. Chem. Soc. (2000) 122:8801-8802.
Gudiksen, M.S. et al., "Growth of nanowire superlattice structures of nanoscale photonics and electronics" Nature (2002) 415-617-620.
Gudiksen, M.S. et al., "Synthetic control of the diameter and length of single crystal semiconductor nanowires" J. Phys. Chem. B (2001) 105: pp. 4062-4064.

Holzapfel, M., et al., "A new type of nano-sized silicon/carbon composite electrode for reversible lithium insertion", Chem. Commun., Jan. 26, 2005; pp. 1566-1568; The Royal Society of Chemistry 2005.
Hung et al. "Room-temperature formation of hallow $Cu_2O$ nanoparticles" Adv. Mat (2010) 22:1910-1914.
Huang, R. et al. "Carbon-coated Silicon Nanowire Array Films for High-Performance Lithium-Ion Battery Anodes" Appl Phys Lett (Oct. 1, 2009) 95, pp. 33119-1 to 133119-3.
Kolasinski, K. W., "Catalytic growth of nanowires: Vapor-liquid-solid, vapor-solid-solid, solution-liquid-solid and solid-liquid-solid-growth", Current Opinion in Solid State and Materials Science, vol. 10, Issues 3-4, Jun.-Aug. 2006, pp. 182-191; Elsevier.
Kooti et al. "Fabrication of Nanosized Cuprous Oxide Using Fehling's Solution" Scientific Iranica Transation F: Nanotech (2010) 17(1): pp. 73-78.
Kuo et al. "Seed-Mediated Synthesis of Monodispersed $Cu_2O$ Nanocubes with Five Different Size Ranges from 40 to 420 nm" Adv Func Mat (2007) 17: pp. 3773-3780.
Li et al. "Complex chemistry & the Electroless Copper Plating Process" Plating & Surface Finishing (2004):40-46, American Electroplaters and Surface Finishers Society.
Li, H., et al., "The crystal structural evolution of nano-Si anode caused by lithium insertion and extraction at room temperature", Solid State Ionics, vol. 135, Issues 1-4, Nov. 2000, pp. 181-191; NH Elsevier.
Liu et al. "Modification of synthetic graphite for secondary lithium-ion battery applications" J Power Sources (1999) 81-82:187-191.
Liu, Y., et al., "Novel negative electrode materials with high capacity density for further rechargeable lithium ion batteries", Res. Rep. Fac. Eng. Mie Univ., vol. 29, Oct. 20, 2004; pp. 65-72.
Lu et al. "Electrochemical and thermal behavior of copper coated type MAG-20 natural graphice" Electrochemica Acta (2002) 47(10):1601-1606, International Society of Electrochemistry.
Manna, L. et al. "Epitaxial growth and photochemical annealing of graded CdS/ZnS shells on colloidal CdSe nanorods" J. Am. Chem. Soc. (2002) 124:7136-7145.
Morales, A.M. et al., A laser ablation method for the synthesis of crystalline semiconductor nanowires, Science (1998) 279:208-211.
Peng, X. et al. "Epitaxial growth of highly luminescent CdSe/CdS core/shell nanocrystals with photostability and electronic accessibility" J. Am. Chem. Soc. (1997) 119:7019-7029.
Peng, X. et al. "Shape control of CdSe nanocrystals" Nature (2000) 404:59-61.
Puntes, V.F. et al., "Colloidal nanocrystal shape and size control: The case of cobalt" Science (2001) 291:2115-2117.
Qian et al. "Synthesis of Germanium/Multi-walled Carbon Nanotube Core-Sheath Structures via Chemical Vapor Deposition" Nanowires Sci & Tech (2010) pp. 113-130, INTECH.
Renard et al. "Catalyst preparation for CMOS-compatible silicon nanowire synthesis" Nature Nanotech (2009) 4:654-657.
Siperko "Scanning tunneling microscopy studies of Pd—Sn catalyzed electroless Cu deposited on pyrolytic graphite" J Vacuum Sci & Tech A (1991) 9(3):1457-1460.
Urban, J.J. et al. "Synthesis of single-crystalline perovskite nanowires composed of barium titanate and strontium titanate" J. Am. Chem. Soc. (2002) 124(7):1186-1187.
Wu et al., "Block-by-Block Growth of Single-Crystalline Si/SiGe Superlative Nanowires", Nano Letters, 2002, No. 2, vol. 2, pp. 83-86.
Xu et al. "Preparation of copper nanoparticles on carbon nanotubes by electroless plating method" Mat Res Bulletin (2004) 39:1449-1505.
Yang, J., et al., "Si/C Composites for High Capacity Lithium Storage Materials", Electrochemical and Solid-State Letters, vol. 6, Issue 8, Aug. 1, 2003; pp. A154-A156.
Yin et al. "Copper Oxide Nanocrystals" J Am Chem Soc (2005) 127, pp. 9506-9511.
Yu "A novel processing technology of electroless copper plating on graphite powder" Mat Protection (2007) 40(9): pp. 25-27.
Yu et al. "Synthesis and Characterization of Monodispersed Copper Colloids in Polar Solvents" Nanoscale Re Lett (2009) 4: pp. 465-470.

(56) References Cited

OTHER PUBLICATIONS

Yun et al., "Ferroelectric Properties of Individual Barium Titanate Nanowires Investigated by Scanned Probe Microscopy", Nanoletters, 2002, vol. 2, No. 5, pp. 447-450.
Zuo, P., et al., Electrochemical stability of silicon/carbon composite anode for lithium ion batteries, Electrochimica Acta, vol. 52, Issue 15, Apr. 20, 2007; pp. 4878-4883.
International Search Report and Written Opinion in International Application No. PCT/US2017/042246, dated Jan. 2, 2018.
Japanese Notice of Allowance in Japanese Application No. 2017-078418, dated May 15, 2018.
Korean Office Action in Korean Application No. 10-2018-7025051, dated Nov. 20, 2018.
Arbiol et al, "Influence of Cu as a catalyst on the properties of silicon nanowires synthesized by the vapour-solid-solid-mechanism" Nanotechnology 18 (2007) pp. 1-8, IOP Publishing Ltd., Printed in the UK.
Korean Decision to Grant in Korean Application No. 10-2014-7004916, dated May 29, 2018.
EP Communication pursuant to Article 94(3) in EP application No. 12817748.2 dated May 22, 2019.
Extended European Search Report for EP Application No. 17828578.9, dated Feb. 26, 2020.
EP Communication in EP application No. 12817748.2 dated Aug. 17, 2018.
EP Communication pursuant to Article 94(3) in EP application No. 12817748.2 dated Feb. 4, 2021.
Chinese Office Action in Chinese Application No. 2018-10147669.1, dated Feb. 24, 2021.
Chinese Search Report in Chinese Application No. 2018-10147669.1, dated Feb. 19, 2021.
Extended European Search Report in European Application No. 20195843.6, dated Jan. 19, 2021.
Chinese Board Decision directed to related Chinese Application No. 201280041299.4, mailed Nov. 13, 2017.
Japanese Notice of Allowance in Japanese Application No. 2014-522942, dated Mar. 14, 2017.
Office Action in U.S. Appl. No. 14/234,565, dated Jan. 17, 2018.
Notice of Allowance in U.S. Appl. No. 14/234,565, dated Dec. 10, 2018.
Notice of Allowance in U.S. Appl. No. 14/234,565, dated Nov. 15, 2018.
Xiong, Yujie, et al., From Complex Chains to 1D Metal Oxides: A Novel Strategy to Cu2O Nanowires; J. Phys. Chem. B, vol. 107, No. 16, 2003, pp. 3697-3702.
Chinese Office Action in Application No. CN 201780056498.5, dated Dec. 30, 2021.
Chinese Search Report in Application No. CN 201780056498.5, dated Dec. 30, 2021.
Extended European Search Report in EP application No. 21199255.7 dated Feb. 10, 2022.
EP Communication pursuant to Article 94(3) in EP application No. 12817748.2 dated May 18, 2020.
Chinese Office Action in Chinese Application No. 2018-10147669.1, dated May 28, 2020.
Notice of Allowance in U.S. Appl. No. 15/650,775, dated Jul. 1, 2020.
Japanese Office Action in Application No. JP 2019-502003, dated Feb. 21, 2022.
Japanese Office Action in Application No. JP 2019-502003, dated Jul. 19, 2021.
Chinese Third Office Action in Chinese Application No. 2018-10147669.1, dated Sep. 10, 2021.
Szczech J.R. et al., "Nanostructured Silicon for High Capacity Lithium Battery Anodes" Table ESI 1-7; Department of Chemistry, University of Wisconsin-Madison, 1101 University Avenue, Madison, Wisconsin, 53706; 2011, 12 pp., USA.
Szczech J.R. et al., "Nanostructured Silicon for High Capacity Lithium Battery Anodes" Energy Environ. Sci., 2011, 4, pp. 56-72.
Mei L.P. et al., "A Glassy Carbon Electrode Modified with Porous Cu2O Nanopheres on Reduced Graphene Oxide Support for Simultaneous Sensing of Uric Acid an Dopamine with High Selectivity Over Ascorbic Acid", Microchim Acta (2016) 183: pp. 2039-2046.
Office Action in U.S. Appl. No. 16/355,454, dated Mar. 30, 2022.
Notice of Allowance in U.S. Appl. No. 16/355,454, dated Feb. 1, 2023.
Chinese Certificate of Patent in Application No. 2018-10147669.1, Patent No. ZL201810147669.1, dated May 3, 2022.
Korean Office Action in Application No. KR 2019-7004648, dated May 18, 2022.
Liu Y. et al., "Catalyst-free growth of SiC nanowires in a porous graphite substrate by low pressure chemical vapor infiltration", Ceramics International 40; Apr. 13, 2014; pp. 11889-11897, ELSEVIER.
Chinese Certificate of Patent in Application No. 201780056498.5, Patent No. ZL201780056498.5, dated Sep. 9, 2022.
Japanese Notice of Allowance in Application No. JP 2019-502003, dated Sep. 5, 2022.

\* cited by examiner

MANUFACTURING APPARATUS AND METHOD FOR MAKING SILICON NANOWIRES ON CARBON BASED POWDERS FOR USE IN BATTERIES

CROSS REFERENCE TO RELATED APPLICATIONS

This application claims priority to, and the benefit of, U.S. Provisional Patent Application Ser. No. 62/363,087 filed Jul. 15, 2016 and titled "Manufacturing Apparatus And Method For Making Silicon Nanowires On Carbon Based Powders For Use As Anodes In The Battery Industry, the disclosure of which is herein incorporated by reference in its entirety.

FIELD

Embodiments of the present application relate generally to manufacturing apparatus, systems and methods of growing silicon (Si) nanowires on carbon based substrates, such as on the particles of graphite powders, to economically make silicon-carbon hybrid active materials to be used for example in lithium ion batteries. More specifically, embodiments of the present application relate to an inventive tumbler reactors and chemical vapor deposition (CVD) systems and methods for growing silicon nanowires on carbon based substrates at large-scale quantities to meet the growing demand for active materials for the battery industry.

BACKGROUND

The development of improved battery technology continues to attract significant effort and resources. Lithium ion batteries (LIBs) are one of the most promising areas for further advancement. LIBs generally are comprised of an anode, a cathode, a separator material separating the cathode and the anode, and an electrolyte. The anode of most commercially available LIBs generally includes a copper foil current collector coated with a mixture of graphite powder, a binder material and/or conductive additives. The cathode of most commercially available LIBs generally includes an aluminum foil current collector coated with a lithium transition metal oxide based cathode material. Traditional LIB anodes include intercalation-based active materials, such as natural or synthetic graphites, which have limited charge capacity and are falling short of the rising market demand for higher energy density (volumetric or gravimetric), higher power density, greater cycling life, longer battery lifespan, faster charging rates, larger temperature charging range or operating range, lesser swelling, and other key performance metrics.

Various anode materials with improved storage capacity and thermal stability have been proposed for lithium-ion batteries (LIBs) in the last decade. Silicon (Si) has been studied extensively as an anode active material in LIBs due to its attractive characteristics. The theoretical specific capacity of carbon-based active material is 372 mAh/g, based on the intercalation ratio of one lithium atom (Li) per 6 carbon atoms (C). Alloys of Si and Li can be formed with higher ratios of Li to Si than the ratio of ⅙ between Li and C atoms in a fully lithiated carbon-based material. In these alloys, the ratio of Li/Si ranges from 1.71 for the alloy phase $Li_{12}Si_7$ (with a theoretical capacity of 1636 mAh/g) to 3.75 for the alloy phase $Li_{15}Si_4$ (with a theoretical capacity of 3579 mAh/g). The richest alloy phase $Li_{22}Si_5$ has a ratio of 4.4 and a theoretical capacity of 4,200 mAh/g, but it is typically not reached in practical applications. In addition to higher specific capacity, Si has slightly higher voltage plateau than that of graphite, so it has attractive safety characteristics. Furthermore, Si is an abundant and inexpensive material, and lithiated Si is more stable in typical lithium-ion battery electrolytes than lithiated graphite.

Despite the attractive characteristics of silicon, commercialization attempts to utilize Si as an active material for LIBs have been unsuccessful. Several factors have contributed to this lack of success, including the lack of practical solutions to address the detrimental consequences of the high volumetric expansion and contraction of Si during lithiation and delithiation, the lack of solutions to address the short cycle life of cells with Si-based anodes, and the lack of suitable methods available for mass producing high-quality Si-based anodic materials at a reasonable cost compared to the existing commercial carbon-based actives materials, even when cost comparisons take into account the improved specific capacity of silicon-comprising anodes.

According to the present invention, active materials based on Si nanowires grown and/or attached onto carbon based substrate, such as graphite particles, can be produced in large quantities at attractive costs and address prior limitations of other silicon comprising active anode materials for LIBs. Nanowires are typically described as "one-dimensional nanostructures" because of very small radius and high length/radius aspect ratio. For example, the nanowires can have an average diameter less than about 200 nm, e.g., between about 5 nm and about 100 nm, e.g., between 20 nm and about 50 nm. Si nanowires exhibit aspect ratios (length-to-width ratio) of 5, 10 or 15 or more, 25 or more, 50 or more, or even greater than 100. Si nanowires present unique physical, chemical and electrical properties making them suitable to overcome many of the side effects produced by other forms of silicon-comprising materials when they are used as anode active material in LIBs. Specifically, during the lithiation (charging) and delithiation (discharging), the high surface curvature (i.e. small diameter) of the Si-nanowires provides a lower energy barrier for lithium insertion and allows for an easier release of mechanical stress due to lithium ions disrupting the silicon structure. After first cycle, the nanowire's crystalline structure typically becomes amorphous and the nanowires become more flexible, adjusting to volume changes without exhibiting cracks.

When silicon nanowires are grown directly onto the surface of graphite particles, each nanowire is free to expand and contract while remaining attached at one end, where the nanowire is attached to and makes electrical contact with the surface of the graphite particle. Once lithiated, the alloy formed by the combination of lithium and silicon atoms greatly increases conductivity, enabling the efficient transport of electrons along each nanowire to and from the graphitic substrate. The many nanowires attached to the surface of each particle of graphite can expand and contract within the pores between graphite particles while remaining electrically connected at their respective attached points to the carbon-based substrate. Much like in a traditional anode, the graphite particles are in electrical contact with one another, in a porous structure containing a binder and a conductive additive. Thus, the porous anode layer comprises of adjacent graphite particles (each particle connected to a large number of Si nanowires), enabling both the flow of lithium-ions thru the electrolyte to and from the nanowires and the flow of electrons to and from the nanowires thru the graphite particles and eventually to the current collector foil of the anode electrode. Because each nanowire is attached at one end to the graphite substrate, there is no need for the nanowires to make direct electrical contact with one another:

the electrons follow an electrical path from each nanowire thru its attachment on the surface of the graphite particle, and thru the graphite particles to the electrode current collector. Thus, each nanowire is free to flex and change shape during cycling without affecting the electrical connectivity or the mechanical integrity of the anode composite layer.

Manufacturing of large quantities of well controlled Si nanowires has proven complex and difficult and currently no large-scale manufacturing processes or equipment are yet available in a commercial production setting. For example, a CVD batch of 1 Kg of Si nanowires grown on graphite particles with a 10% Si/C ratio will contain approximately 100 grams of silicon nanowires or $10^5$ milligrams, with each milligram comprising typically more than hundred billion (i.e. $10^{11}$) nanowires. As such, the significant benefit of Si nanowires as anode active material for LIBs has not been fully realized yet. This is of significant concern, particularly since global demand for anode active material for LIBs was over 60,000 metric tons in 2015 and it is expected to surpass 100,000 metric tons in 2019 (estimates from Avicenne ENERGY—*The worldwide rechargeable Battery Market*"—July 2015). Today such demand is satisfied mostly by different types of natural or synthetic graphite materials. In a few commercial LIB, the anodes comprise a small percentage of silicon additive, such as silicon oxide ($SiO_x$) particles mixed in with the active material graphite powder.

The availability and cost of Si nanowires composites suitable as anode material for LIBs has been constrained by production methods capable of producing less than a metric ton per year, with low yield and high unit cost. Thus, there is a great need for methods to produce high-quality, Si nanowires materials for use in LIB components and devices in much larger annual quantities, within narrow manufacturing specifications and at a cost adequate to address a fast-growing demand in the order of several tens to thousands of metric tons per year per manufacturing facility. The present invention provides for the fabrication of industrial quantities of material comprising silicon nanowires attached at one end to the surface of graphite particles, within precise specifications and at an acceptable cost following an efficient and automated process.

SUMMARY

Embodiments of the present invention relate generally to manufacturing apparatus, systems and methods of making silicon (Si) nanowires suitable for use as anode active material in lithium ion batteries. In some embodiments, manufacturing apparatus, systems and methods are provided to grow Si nanowires on graphite or carbon powders using chemical vapor deposition (CVD) processes to produce at industrial scale.

In one aspect, embodiments of the present application provide an inventive tumbler reactor and chemical vapor deposition (CVD) system configured to grow silicon nanowires on carbon-based substrate, such as graphite particles or powder, in scaled up quantities. The apparatus and methods of the present application may be used to provide industrial scale anode materials for the LIBs industry. For purposes of this application, the terms tumbler reactor and tumbler are used interchangeably.

In one aspect, a method of manufacturing silicon nanowires is provided in which silicon nanowires are grown onto carbon based substrate by chemical vapor deposition of a silicon containing precursor to form a carbon-based silicon nanowire composite, wherein conversion of the silicon containing precursor to the silicon nanowires is at least 30%, in other embodiments the conversion is at least 50%, or preferably at least 70%, or preferably at least 90%, or even greater than 98%, and wherein at least 1 kg of the composite of silicon nanowires and carbon-based substrate can be produced per batch, preferably in batches greater than 10 Kg each, or even greater than 20 Kg each, and wherein the mass of silicon is at least 4 wt. % of such composite (where the weight percentage is the ratio of the weight of the silicon to the carbon substrate), preferably greater than 8 wt. %, or even greater than 16% silicon to carbon weight ratio. Note that the term "carbon-based silicon nanowire composite" is also sometimes referred to as "carbon-based silicon nanowire composite powder" or simply a "carbon-silicon composite," and that the terms are used interchangeably.

In another aspect, the carbon-based silicon nanowire composite is further processed to form an anode, by coating an electrode foil according to techniques known in the art. In another embodiment, the anode is further combined with a cathode, a separator and an electrolyte to form a lithium ion battery.

As described in more detail in the description provided below, embodiments of the inventive apparatus and system include one or more of the following features. A Low-Pressure CVD system (LPCVD) configured, modified and/or adapted to provide faster cooling and heating of the CVD chamber. The LPCVD system may be configured to move the furnace heating/cooling unit that heats and cools the process tube and tumbler reactor away from the chamber to increase the furnace utilization efficiency. In some embodiments, a carriage rail with wheels is provided and configured to allow the tumbler reactor to move in and out of the metal or quartz process tube. The carriage rail may also be configured to support the tumbler reactor when it is heavy for large load of carbon-based silicon nanowires composite. In other embodiments, the tumbler reactor may be kept in a fixed position with respect to the furnace assembly and the heating and cooling elements may be moved along the same axis as that of the tumbler. In some embodiments, a metal process tube is used, thereby replacing a quartz process tube, to enable the loading of heavier powder material into the tumbler reactor, which enables greater Si nanowires production volume. In some embodiments, the apparatus of the present application is configured to provide carbon based-silicon nanowires composite production volume of up to hundreds or even thousands of metric tons per year. The capability to produce at such scale is a significant advantage over prior manufacturing techniques, and the greater production volume provided by the apparatus and system of the present invention will enable the widespread adoption of carbon based-silicon nanowires composite as anode materials for the battery industry.

In some embodiments the LPCVD system of the present application integrates a tumbler reactor having a rotating and mixing mechanism. In some embodiments, the rotating and mixing mechanism is coupled with a gas manifold and optionally with one or more scrapers. The gas manifold may be comprised of several configurations to manage gas distribution throughout the tumbler reactor. For example, the gas manifold may be a single elongated member, or may be U-shaped, or may be a frame manifold, and the like. Optionally, the gas manifold may be combined with one or more scrapers. Optionally, the tumbler may be cylindrical and its cross section may be circular or polygonal. The tumbler may consist of one of more batch chambers of similar length, or may consist of a helicoidally configured continuous chamber. In a helicoidal configuration, a rotating helix may push the substrate material forward through a sequence of one or more heating zones, reaction zones and cooling zones where the injection of reactive gases is directed toward the reaction zones where silane is converted into silicon nanowires. The tumbler may be positioned horizontally, vertically or at any angle with respect to the floor onto which the furnace is located.

In some embodiments, the tumbler further comprises one or more fins mounted on one or more inner walls of the tumbler reactor. The fins can be of any suitable size, shape or distribution and are configured to provide control and/or distribution of the powder motion in the tumbler, particularly during injection of process gases. For example, the fins may be configured to prevent the graphite or carbon-based powder from slipping along the walls during rotation of the tumbler reactor. The fins may also assist in lifting the loaded graphite powders as the tumbler reactor rotates, and optionally optimize the precursor gas and heat distribution within the reactor.

In another aspect, embodiments of the present application provide systems and methods that are adaptive to produce silicon nanowires on a variety of different types of natural or synthetic graphite particles to provide flexible and robust manufacturing. For example, the graphite particles may have a low BET (less than 5 sq. m/g) or a high BET (greater than 15 sq. m/g), and may be coated or uncoated, spherical or flaky, or any combination thereof.

Additional features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 1:
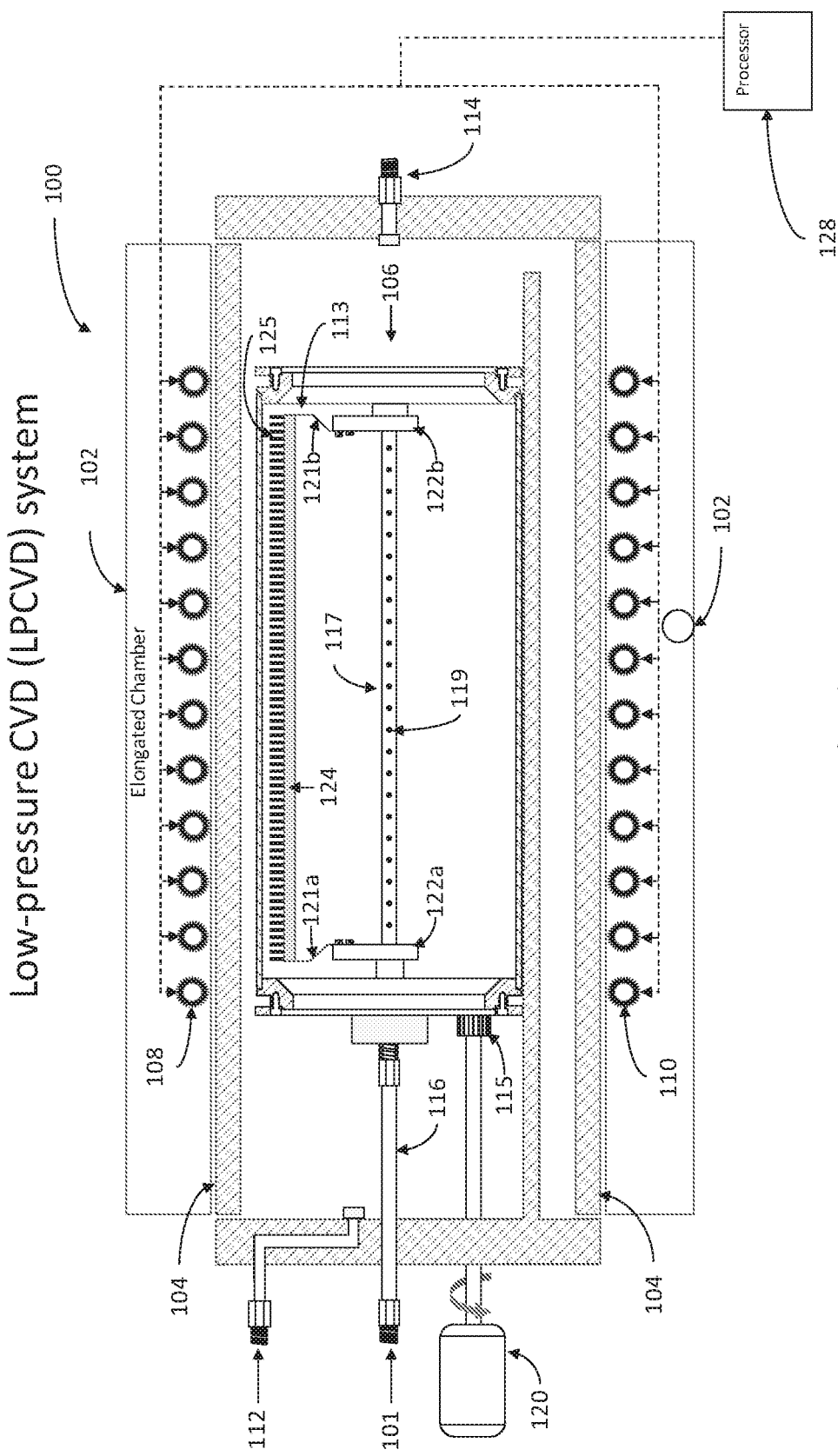
FIG. 1 illustrates a cross-sectional partial view of a tumbler reactor and LPCVD system according to some embodiments of the present application.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Embodiments of the present application relate generally to manufacturing apparatus, systems and methods of making silicon (Si) nanowires suitable for use as anode active material in lithium ion batteries (LIBs). In some embodiments, manufacturing apparatus, systems and methods are provided configured to grow Si nanowires on carbon based substrate, such as graphite particles or any carbon-comprising powders, by chemical vapor deposition to produce increased production volumes.

For context, the inventors would like to point out that as silicon (Si) has attracted more attention as a potential replacement for graphite (C) in the anode of LIBs, numerous limitations have persisted. An atom of Si can combine with a much larger number of Lithium ions than an atom of C. Replacing C with Si could significantly increase the energy density of batteries (theoretical capacity for graphite C is 372 mAh/g while theoretical capacity for Si is 4,200 mAh/g when combined with Li at the alloy phase $Li_{22}Si_5$). However, using conventional bulk silicon (e.g. Si powder or Si particles) in LIBs presents side effects which prevent it from being an ideal anode material. First, poor cycle-life of silicon materials results from pulverization during the large volumetric fluctuations (>300%) which accompany lithium ion insertion in and extraction from the silicon host material. Second, significant irreversible capacity loss and low coulombic efficiency is caused by mechanical fracture of Si anodes during the alloying/dealloying process. Finally, the solid electrolyte interphase (SEI) breaks during cycling, exposing the electrolyte to highly electrochemically active silicon surface. This results in the re-exposure of the silicon surface to the electrolyte and the reformation of further SEI, resulting in the SEI layer growing thicker over many charge/discharge cycles.

The inventors have discovered that the use of Si nanowires grown and attached onto graphite as anode active material in LIBs circumvent the side effects of conventional bulk Si while preserving Si superior energy density compared to C. Si nanowires grown and/or attached onto graphite can have an average diameter less than about 200 nm, e.g., between about 5 nm and about 100 nm, e.g., between 30 nm and about 50 nm. Si nanowires diameters are determined by the catalyst nanoparticle size, for example, Cu2O nanoparticle size is in the range of 5 nm ~200 nm, Si nanowires exhibit aspect ratios (length-to-width ratio) of 5, or 10, or 15 or more, 25 or more, 50 or more, and greater than 100. The Si nanowire length is determined by growth time, temperature, pressure, gas flow rate, catalyst activity and density on the graphite powder surface. When the growth process temperature, pressure, gas flow rate and catalyst/density are selected the growth time mainly controls the Si nanowire length. As such, Si nanowires may be referred to as one-dimensional (1-D) materials due to their length being much greater than their radial dimension. Shape and geometry of Si nanowires facilitate a quick diffusion of lithium ions and mitigate side reactions between Si nanowires and the electrolyte when used in LIBs. Once the Si has been lithiated, the structure of the Si nanowires is transformed from a substantially crystalline to a substantially amorphous structure, and thus the Si nanowires become more flexible and capable to self-organize to better occupy the available space between graphite particles more efficiently. During the few initial cycles of an electrochemical cell having Si nanowires attached on graphite particles as anode active material, a battery manufacturer will typically set the voltage range to a smaller value than the full operating range of the battery and will set the electrical current to a smaller value than the top-rated current specified in the cell data sheet. This approach, typically called "formation protocol", allows for careful building up of the SEI layer onto each silicon nanowire during the first few lithiation cycles performed by the battery manufacturer. After the SEI layer has been formed, the nanowires are protected from merging and/or fusing with adjacent nanowires, and thus can more easily flex and change shape while remaining attached at one end to the surface of graphite substrate. Furthermore, the inventors have found that by becoming flexible and remaining free to expand and contract during each cycle after the initial SEI formation cycles, the silicon nanowires progressively adjust their shape and position along adjacent silicon nanowires attached to the same graphite particle or to neighboring graphite particles. This progressive self-arrangement of the SEI-coated silicon nanowires lead to an efficient and optimized use of the volume provided by the pores between the graphite particles to which the nanowires are attached. Typically, the silicon nanowires occupy a small fraction of the surface of the carbon-based substrate, for example the area where the silicon nanowires are attached represent less than 5% or even less than 1% of the surface of the graphite particle. Thus, there is no need to form or preserve direct electrical contacts between adjacent nanowires along their length, since each nanowire is electrically connected at the attachment point to the carbon-based substrate. In fact, it is preferred to avoid fusing adjacent nanowires, in order to allow each nanowire to flexibly change shape during cycling. Essentially, the Si nanowires attached on the graphite particles become like a sponge material that occupy the pore spaces of the graphite substrate, while significantly limiting the swelling of the electrode. The mechanical and electrical integrity of the anode layer is provided by the interconnected network of graphite particles, held together with a binder and optionally a conductive additive, much like in a traditional graphite-only anode, and the sponge-like collection of silicon nanowires arranged within the pores of the graphite particles absorbs and releases the lithium ions, while enabling the flow of electrons thru the graphite particles to the current collector foil. Additionally, when the silicon is substantially amorphous and the nanowire remains intact, the conductivity of the electrons along the nanowire is excellent. The inventors have found that over hundreds or even thousands of cycles, the nanowires remain attached at one end to the graphite particles and remain free to flex along their axis. Electrons can travel very quickly to and from the carbon-based porous layer which typically adheres to the copper current collector thanks to the binder. This hybrid Si/C material, SEI formation process and anode layer arrangement enable LIBs to have higher energy density and handle greater power, with better capacity retention over charge-discharge cycling than traditional LIBs with graphite-only active anode material or other silicon-comprising anode materials.

Si-nanowires grown on graphite particles result into a powder that can be sieved and used in slurry with existing roll-to-roll battery electrode coating manufacturing equipment. Si nanowires exhibit aspect ratios (length-to-width ratio) of 5, or 10 or 15 or more, 25 or more, 50 or more, and greater than 100. As such Si nanowires may be referred to as one-dimensional (1-D) materials due to their length being much greater than their lateral dimension. Carbon nanotubes (CNT) with Si nanoparticles on the surface are also 1-D materials and they have been described as a potential alternative to Si nanowires as anode active material in LIBs. However, the Si nanoparticles on the CNTs have a surface-to-volume ratio which is much larger than that of the Si nanowires. This distinction causes the physical structure and unique chemical, electrical properties of Si nanowires to be substantially different (and better) than those of carbon nanotubes with Si nanoparticles when used as anode active anode material in LIBs.

For example, while the elements are the same (silicon and carbon) for the Si nanoparticles on CNTs and for the Si nanowires grown on carbon (graphite) powders, the two structures exhibit very different properties and performance. In the case of Si nanowires, the carbon (graphite) is simply the substrate on which the nanowires are attached. Differently from CNT with Si particles on the surface, the Si nanowires have a surface-to-volume ratio which remain approximately constant as their length is increased (i.e. as more atoms of silicon are added), while the surface to volume ratio increases when the number of silicon nanoparticles is increased. This unique geometrical/physical property produces several benefits as described below.

In a LIB, lithium ions move from the cathode to the anode and back through the electrolyte during each charging and discharging cycle. When Si-nanowires are used as active anode material in a LIB, the silicon can be electrochemically very active when in direct contact with the electrolyte, producing side reactions (and by-products) which result into an SEI layer around the Si nanowires. The formation of a SEI layer around the Si-nanowires during the first few cycles provides a more electrochemically passive protection, preventing further silicon-electrolyte reactions while still allowing lithium ions to diffuse through the SEI. Unlike the larger surface-to-volume ratio of Si nanoparticles, Si-nanowires have lower surface-to-volume ratio at equivalent Si mass. Thus, less SEI needs to be formed to passivate the surface of Si nanowires than that of silicon nanoparticles on CNTs. Hence, the electrolyte-silicon side reactions on Si-nanowires consume less electrolyte during SEI formation, produce a more stable SEI layers around the Si-nanowires, and help in retaining reversible capacity thru larger number of cycles.

The inventors have also discovered that lithium ions can lithiate and diffuse fast in the Si nanowires, while lithium ions also intercalate into the graphite particles. Thus, both the silicon in the nanowires and the carbon in the substrate participate to the storage of lithium and the flow of electrons. Upon full lithiation, the ratio of lithium stored in the nanowires to the lithium stored in the graphite particles is related to the weight ratio Si/C in the composite active material. At higher Si/C ratios, a lesser fraction of the lithium is stored within the carbon structures and a greater fraction of the lithium is stored within the silicon nanostructures. Thus, for higher Si/C ratio, less expensive graphite with higher BET can be used to host larger number of Si nanowires because the primary function of the graphite is then to provide a path for the electrons to flow from the nanowires to the current collector rather than storing lithium. The higher surface area of each particle accommodates more nanowires without increasing the surface density of the nanowires onto the surface of each particle. The hybrid solution of combining silicon nanowires grown on graphite particles leverages in a unique way the energy storage properties of silicon and the mechanical and electrical properties of carbon-based active materials.

All these properties, the geometry, the electrochemical activity, the electronic conductivity, and the mechanical strength, are unique to the one-dimensional arrangement of Si nanowires attached at their base to the carbon-based particles and unattached along their length. The inventors have discovered that the combination of these properties make Si nanowires grown on carbon-based particles a unique material for batteries, including LIBs, and have invented the CVD apparatus design and processes required to manufacture this novel material at large scale and economically.

While the inventors have found that Si nanowires on carbon substrate are particularly valuable as materials for batteries, the manufacturing of Si nanowires at industrial scale has been proven to be very difficult, and has not been realized yet. Accordingly, the present application describes novel manufacturing apparatus, systems and methods of making silicon (Si) nanowires suitable for use as anode active material in lithium ion batteries at industrial scale.

According to some embodiments, the carbon-based substrate powders used in the tumbler reactor and system of the present application can be comprised of any one or more of: natural graphite, artificial graphite, soft carbon, hard carbon, and amorphous carbon. Such carbon-based substrate powders have a Brunauer-Emmett-Teller (BET) surface area in the range of approximately 1-30 $m^2/g$, more preferably in the range of approximately 5-30 $m^2/g$ for higher Si wt. % nanowire growth, and a tap density of 0.01-1.5 g/cc. Of significant note, the aforementioned BET values are opposite and teach away from the current conventional high end graphite anode materials which typically need a BET surface area to be less than 2 $m^2/g$. The carbon-based substrate powders of the present application can be modified by its surface coating, such as carbon coating, by decomposing organic compounds such as acetylene, methane, carbon monoxide, sugar, and polymers such as CMC, PVDF, PAA, PVA and polymer mixtures.

Catalyst nanoparticles, such as Au or Cu or $Cu_2O$ and the like, are deposited on the carbon-based substrate powder surface to catalyze silane decomposition for Si nanowire growth. Au catalyst has a Vapor-Liquid-Solid (VLS) nanowire growth mechanism while Cu or $Cu_2O$ have a Vapor-Solid-Solid (VSS) nanowire growth mechanism which enables much higher Si wt. nanowire growth on the carbon-based substrate, as described in greater detail for example in United States published patent application nos. US 2015/0086871 and US 2010/0297502, the disclosures of which are incorporated herein by reference in their entirety.

Fabrication of the Si nanowires anode material is based on the inventive industrially-sized combined fixed- and fluidized-bed reactor design and system as described herein, which allows each batch to load the graphite powder at a large scale, for example from 0.5 kg, 1 kg, 1.5 kg, 2 kg and 2.5 kg up to 5 kg, or 10 kg or 100 kg or 500 kg to produce Si nanowire-graphite composite materials with larger than 4 wt. % Si. A "batch" size is understood to mean the weight of silicon-carbon composite powder that is produced in a single reactor chamber during the "growing step" of the process. In a continuous process, a "batch" size is weight of the silicon-carbon composite powder produced per hour in a single processing apparatus. Of significant advantage, the tumbler reactor and CVD system of the present application are highly scalable. In some embodiments, the tumbler reactor is capable of producing at least 1 kg of Si nanowires on graphite powder per batch (1 kg/batch). In some embodiments, the tumbler reactor produces at least 10 kg of Si nanowires on graphite powder per batch (10 kg/batch), or at least 100 kg of Si nanowires on graphite powder per batch (100 kg/batch).

Of one advantage, among others, the system and manufacturing method of the present application achieves utilization or conversion of the Si source material (e.g. Silane) to Si nanowires approaching 100%. In some embodiments, utilization of the Si source material is in the range of about 30-100%, or in the range of 30-99.5%, and more usually in the range of about 70-99.5%. In one exemplary embodiment, Si nanowires are grown in the system described herein using the following conditions: temperature of about 300-900° C., silane concentration of about 5-100% in the process gas mixture of: $SiH_4$ of about 5-100 wt. %, He (or Ar or $N_2$) of about 0-50 wt. %, and $H_2$ of about 0-50 wt. %, at a growth time in the range of about 10-500 minutes. The aforementioned conditions and tumbler rotation are preferably controlled by computer with automatic software for the production.

In another aspect, embodiments of the tumbler reactor, system and method provide surface density control which enables the selective formation of varying Si wt. % on the carbon powders. For example, the higher BET surface area graphite powders combined with the use of $Cu_2O$ catalysts enable uniform Si nanowires growth of 35 wt. % or more of Si as the Si nanowire surface density (simply, Si %/$m^2$) on the substrate surface can be controlled on a suitable graphite substrate having BET surface area in the range of about 1-30 $m^2/g$. For example, if we take one gram of the powder, 8 wt. % Si nanowires on a 5 $m^2/g$ graphite (for example the graphite available from Hitachi) have a nanowire surface density of 8 wt. % Si/5 $m^2$=1.6 wt. % Si/$m^2$, which equals 32 wt. % Si nanowires on KS6 type graphite with a surface area of 20 $m^2/g$, i.e. 32 wt. % Si/20 $m^2$=1.6 wt. % Si/$m^2$. When length and diameter of Si nanowires are identical for the 8 wt. % Si nanowires on the 5 $m^2/g$ graphite and the 32 wt. % Si nanowires on the 20 $m^2/g$ graphite, the number of Si nanowires per square meter of the substrate surface will be similar. The inventors have first discovered such surface density control, which enables 32% Si anode material to be cycled in the cells as well as 8% Si anode material, because the volume expansion of Si nanowires during lithiation can be accommodated by more void spaces among the graphite particles in the anode composite layer.

Turning now to Figures, embodiments of the present application are shown illustrating the inventive tumbler reactor and chemical vapor deposition (CVD) system configured to grow silicon nanowires on graphite or carbon-based powders in scaled up quantities.

Referring to FIG. 1, a low-pressure CVD (LPCVD) system 100 is shown, generally comprised of an elongated CVD chamber 102, process tube 104 and tumbler reactor 106. The CVD chamber 102 includes heating elements 108 and 110, respectively, which are typically controlled by a processor 128 to heat and cool the process tube 104 and tumbler reactor 106 according to a particular process recipe. In this embodiment, the process tube 104 is an elongated cylindrical tube formed of quartz and is positioned inside of the CVD chamber 102. During operation, the process tube 104 is maintained under vacuum. Purge gas, typically nitrogen, is injected into the process tube by vacuum port 112, and an exhaust port 114 connected to a vacuum pump and a cyclone (not shown) is provided at the output end of the process tube 104 to provide the low pressure environment.

Tumbler reactor 106 is comprised of an elongated, cylindrical metal chamber and is positioned inside of the process tube 104. The tumbler reactor 106 is configured to rotate inside of the process tube. An electric motor 120 drives the rotation of tumbler 106 via rotation gear 115.

Tumbler reactor 106 includes a gas manifold 116 for injecting process gases into the reactor. Any suitable silicon containing process gas may be injected through gas manifold 116. In some embodiments, silane in combination with one or more inert gases, such as nitrogen, helium, argon, and/or hydrogen is injected into tumbler reactor 106 through gas manifold 116. In some embodiments, gas manifold 116 is comprised of a single elongated gas injection member 117 that extends at least a portion of, or the substantial length of tumbler reactor 106. In some embodiments, a plurality of injection ports 119 are positioned along the gas injection member 117 to inject process gases into tumbler reactor 106. Preferably, the injection ports are substantially equally distributed along the gas injection member to provide substantially uniform distribution of the process gas within the tumbler reactor. In some embodiments, the gas injection member 117 is stationary. Alternatively, the gas injection member 117 may rotate. Some process gases are injected into the tumbler reactor 106 by gas purge line 112.

Optionally, tumbler reactor 106 further includes one or more scrapers 113. Scraper 113 is configured to scrap at least a portion of the inner walls of tumbler reactor 106 to prevent build-up of powder on the inner walls. In some embodiments, scraper 113 is positioned at one or more of the ends of the tumbler reactor and scraps powder from the periphery of the tumbler reactor. In another embodiment, scraper 113 may be comprised of an elongated blade that extends at least a portion of, or the substantial length of the tumbler reactor 106 to scrap powder buildup along the inner wall. In yet another embodiment, scraper 113 may be integrated with gas manifold 116.

In the exemplary embodiment shown in FIG. 1, scraper 113 is attached to the gas injection member 117 by attachment members 121a and 121b which are secured to the feedthrough of flanges 122a and 122b disposed at opposite ends of gas injection member 117. The flanges may be fixed and vacuum-tightened, and thus the scraper 113 will likewise be stationary. In this embodiment, the tumbler reactor 106 rotates while the scraper stays stationary. Alternatively, scraper 113 may be configured to rotate. In the exemplary embodiment, scraper 113 is comprised of an elongated blade 124, the outer side of which scraps powder from the inner wall of the tumbler reactor 106 during tumbler rotation. Alternatively, the elongated blade 124 may include a brush-like member 125 positioned along a portion or the substantial length of the outer side of blade 124, such that the brush-like member 125 scraps powder from the inner wall of the tumbler reactor 106 during tumbler rotation.

Figure 2A:
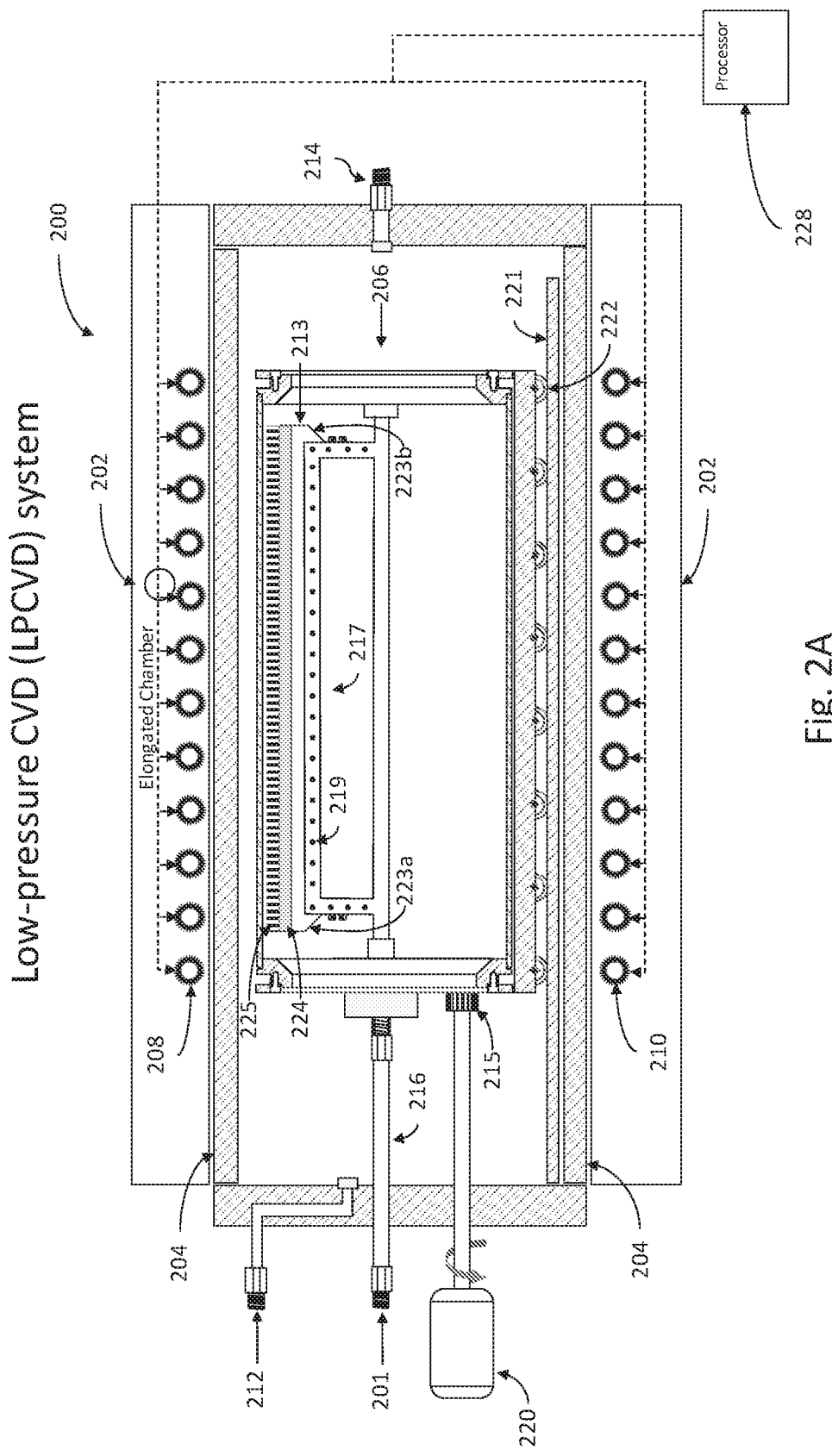
FIGS. 2A and 2B show cross-sectional partial views of two different tumbler reactor and LPCVD system configurations according to some embodiments of the present application.

FIG. 2A illustrates another embodiment of a low-pressure CVD (LPCVD) system 200, and is generally comprised of an elongated CVD chamber 202, process tube 204 and tumbler reactor 206. The CVD chamber 202 includes heating elements 208 and 210, which are controlled by a processor 228 to heat the CVD chamber according to a particular process recipe. In this embodiment, the process tube 204 is an elongated cylindrical tube formed of metal. The process tube 204 is evacuated by purge gas via port 212 to provide a low-pressure environment. The process tube 206 is exhausted by exhaust port 214 positioned at the output end of the process tube 204 and connected to a vacuum pump and a cyclone (not shown). The tumbler reactor 206 is configured to rotate inside of the process tube 204. An electric motor 220 drives the rotation of tumbler reactor 206 via rotation gear 215.

To increase throughput and reduce process time between cycles, LPCVD system 200 is adapted to provide faster cooling and heating of the process tube 204 and tumbler reactor 206. In this embodiment, the tumbler reactor 206 is configured to be removed from the CVD chamber 202. In this way, the tumbler reactor 206 and process tube 204 may be removed from the CVD chamber 202 once the process is complete, and then allowed to cool, while another tumbler reactor and process tube are placed into the process tube and CVD chamber. This configuration allows for faster processing since the CVD chamber does not need to be cooled and then heated for each batch, thereby increasing utilization efficiency of the system.

In this embodiment, CVD system 200 further includes a carriage rail 221 with wheels 222 that is configured to slide the tumbler reactor 206 in and out of the process tube 204 and to support the tumbler reactor 206. The carriage rail allows the tumbler reactor 206 to move in and out of the metal process tube 204. The carriage rail also supports the tumbler reactor 206 when it is heavy with powders. In some embodiments, a metal process tube 204 is used, thereby replacing a quartz process tube, to enable loading of heavier powder material into the tumbler reactor 206, which provides increases Si nanowire production volume. In an alternative embodiment, the tumbler reactor 206 and process tube 204 are configured to slide in and out of the CVD chamber 202.

Tumbler reactor 206 includes a gas manifold 216 for injecting process gases into the reactor. In some embodiments, gas manifold 216 is comprised of a single elongated gas injection member that extends the substantial length of tumbler reactor 206. In the exemplary embodiment, the gas manifold is comprised of a U-shaped gas injection member 217. In some embodiments, a plurality of injection ports 219 are positioned along the U-shaped gas injection member 217 to inject process gases into tumbler reactor 206. Preferably, the injection ports are substantially equally distributed along the gas injection member to provide substantially uniform distribution of the process gas within the tumbler reactor. In some embodiments, the U-shaped gas injection member 217 is stationary. Alternatively, the U-shaped gas injection member 217 may rotate.

The tumbler reactor 206 may further include one or more scrapers 213 as described above with respect to FIG. 1. Scraper 213 is configured to scrap at least a portion of the inner walls of tumbler reactor 206 to prevent build-up of powder on the inner walls. In some embodiments, the scraper 213 is positioned at one or both of the ends of the tumbler reactor and scraps powder from the periphery. Alternatively, scraper 213 may be comprised of an elongated blade that extends the substantial length of the tumbler reactor 206 to scrap powder buildup along the inner wall. In yet another embodiment, scraper 213 may be integrated with U-shaped gas manifold 216.

In the exemplary embodiment shown in FIG. 2A, the scraper 213 is attached to the gas injection member 217 by attachment members 223a and 223b secured to opposite ends of U-shaped gas injection member 217. In this embodiment, the tumbler reactor 206 rotates while the U-shaped gas injection member 217 and scraper 213 stay fixed. Alternatively, U-shaped gas injection member and scraper may be configured to rotate. In the exemplary embodiment, scraper 213 is comprised of an elongated blade 224 with a brush-like member 225 positioned along a portion or the substantial length of the outer side of blade 224, such that the brush-like member 225 scraps powder from the inner wall of the tumbler reactor 206 during rotation.

Figure 2B:
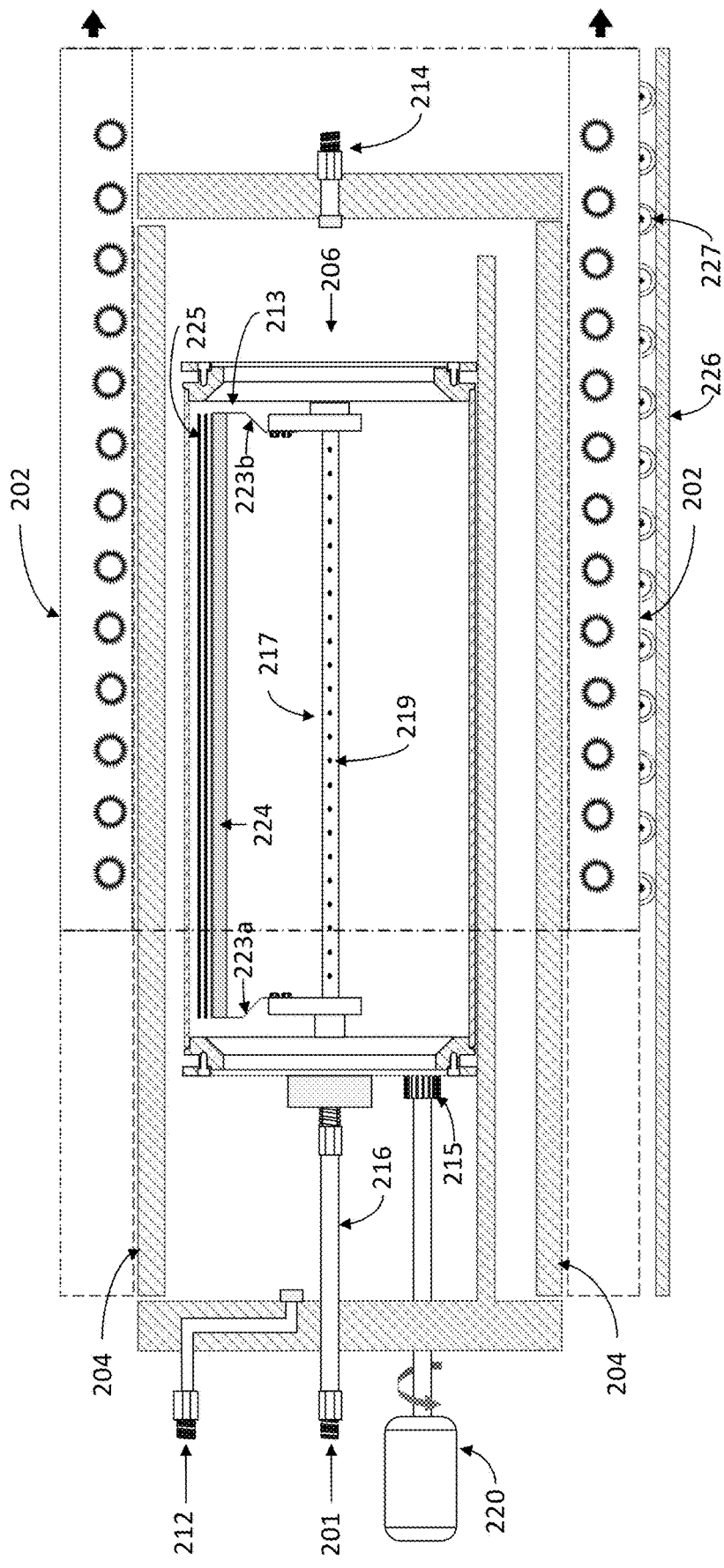

An alternative embodiment is illustrated in FIG. 2B, wherein to increase throughput and reduce process time between cycles, the CVD chamber 202 is moved away from the process tube 204 and tumbler reactor 206, as shown generally by the direction of the arrow in FIG. 2B. In this way, CVD chamber 202 with its heating elements 108, 110, is pulled away from the tumbler reactor 206 and process tube 204 once the process is complete, and thus may then receive another tumbler reactor and process tube for more processing. This configuration allows for faster processing since the CVD chamber does not need to be cooled and then heated for each batch, thereby increasing utilization efficiency of the system. To move the CVD chamber 202, a carriage rail 226 with wheels 227 are positioned to carry and slide the CVD chamber 202 away from the process tube 204 and tumbler reactor 206.

Figure 3A:
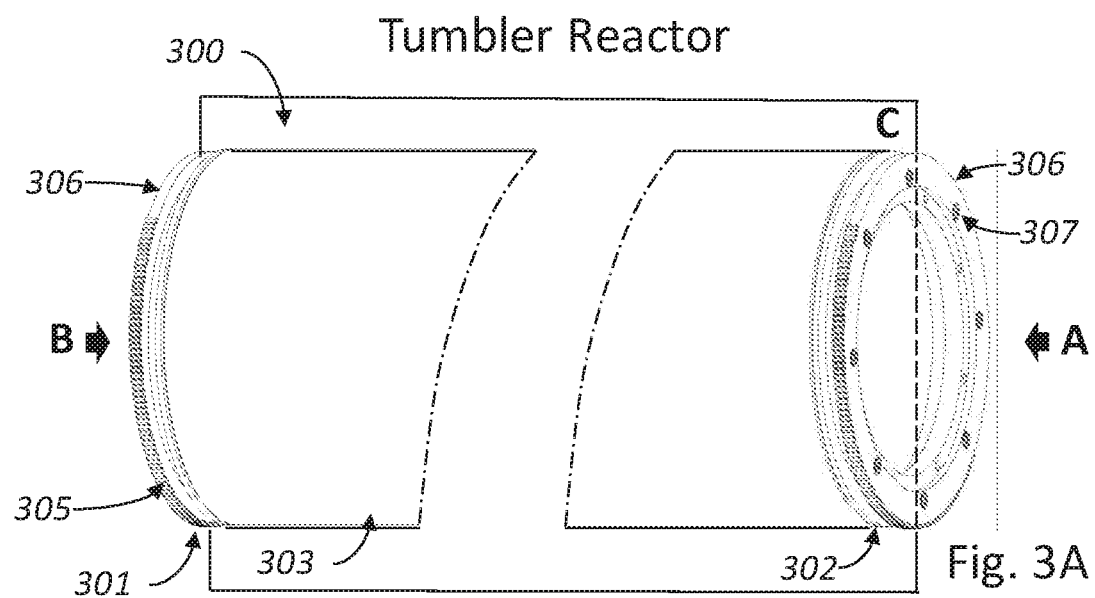
FIGS. 3A-3D illustrate a partial cross-sectional view of a tumbler reactor, two end views of a tumbler reactor, and bottom cut-away view of a tumbler reactor, respectively, according to some embodiments of the present application.
Figures 3B, 3C:
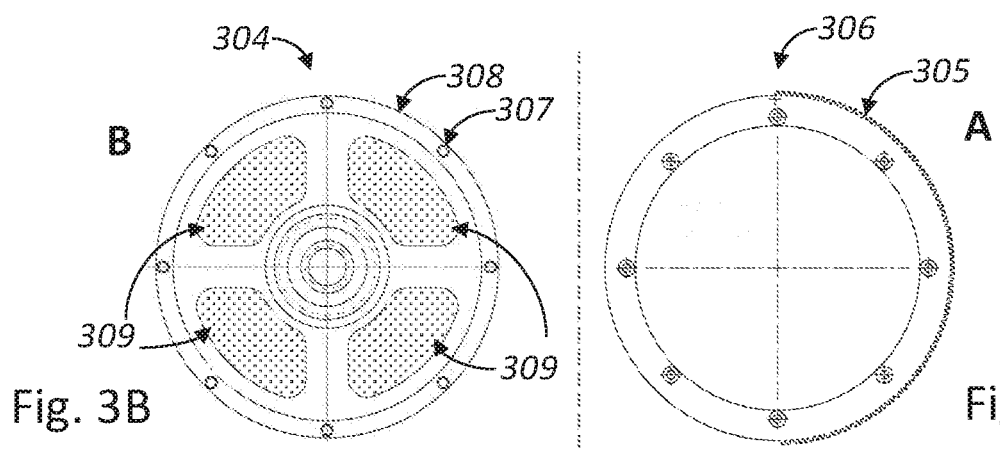
Figure 3D:
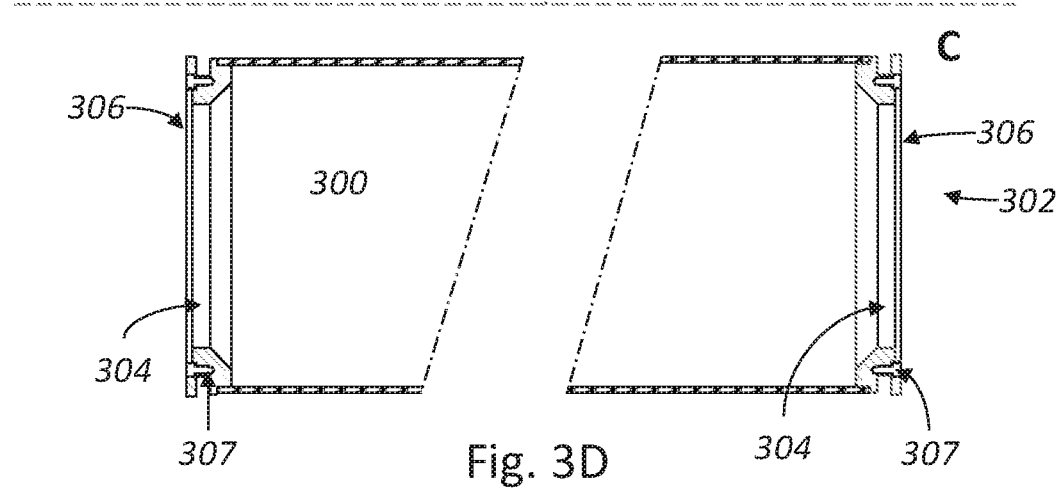

FIGS. 3A-3D represent different views of one embodiment of tumbler reactor 300. More specifically, FIG. 3A illustrate a partial cross-sectional view of exemplary tumbler reactor 300, FIGS. 3B and 3C shows partial end views of tumbler reactor 300, and FIG. 3D shows a partial bottom cut-away view of tumbler reactor 300 In this embodiment, tumbler reactor 300 is comprised of an elongated cylindrical tube 303, having first 301 and second 302 ends. Both ends 301 and 302 are generally comprised of a mesh end cap 304 and end plate 306. End plate 306 has a toothed outer edge 305 that extends the entire periphery of the end plate 306 which serves as a gear to rotate the tumbler reactor 300 (for simplicity only a portion of the toothed outer edge is illustrated in the figures). The outer gear 305 engages smaller rotation gear 115, 215 (FIGS. 1, 2A and 2B), coupled to motor 120 to drive the rotation the tumbler reactor 300. A frame 308 (FIG. 3B) may be provided for securing the mesh end cap and the end plate via attachment bolts 307. Frame 308 includes apertures configured to receive various components, such as for example the injection manifold 116, 216.

Of particular advantage, mesh end cap 304 is comprised of a mesh having a plurality of apertures 309 which are sized to allow flow of the process, purge and other gases between the tumbler reactor and the process tube, while containing the graphite powder inside the tumbler reactor and prohibiting the flow of any graphite powder into the process tube. The size of the mesh apertures 309 in the mesh end cap 304 can vary depending on the size and/or shape of the graphite powder loaded into the tumbler reactor 300. The mesh end cap 304 enables uniform gas distribution from the gas manifold to the graphite powder inside the tumbler reactor.

Figure 4A:
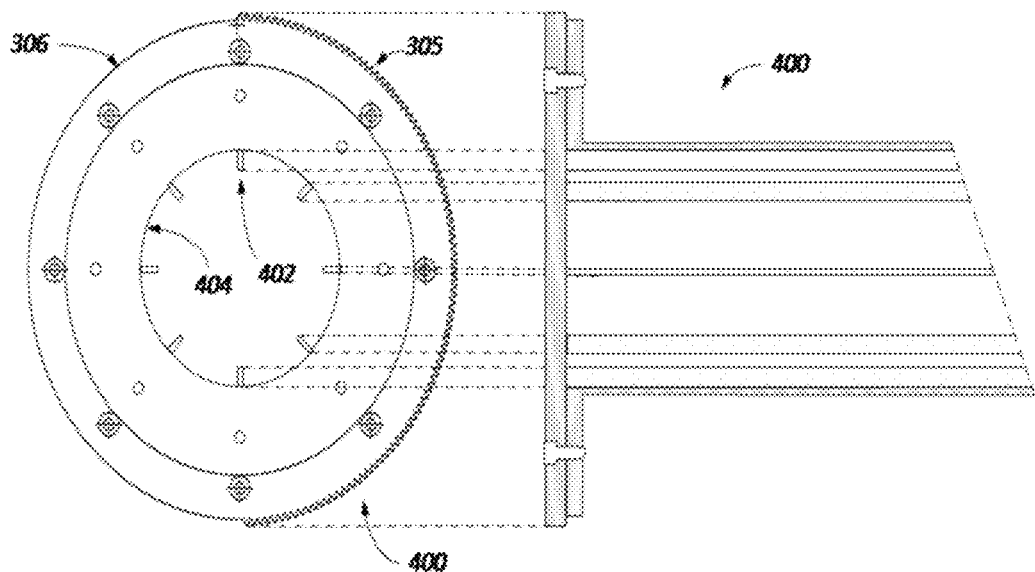
FIGS. 4A, 4B and 4C illustrate end views of the tumbler reactor showing various configurations of fins on the inner walls of the tumbler reactor, according to some embodiments of the present application.
Figure 4B:
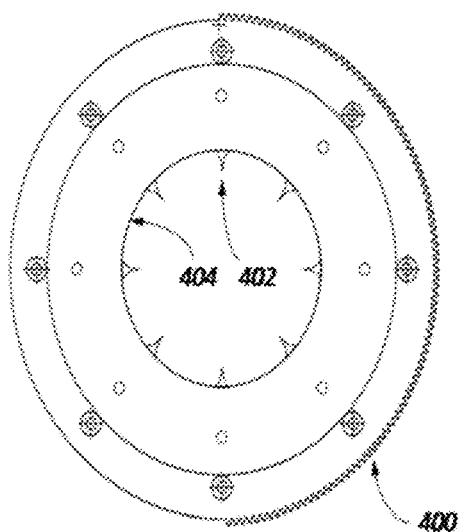
Figure 4C:
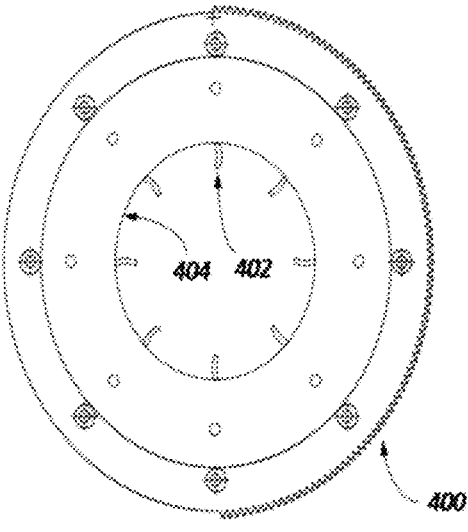

One embodiment of the tumbler reactor 400 is shown in more detail with reference to FIGS. 4A-4C. Tumbler reactor 400 includes one or more fins 402 mounted or formed on one or more inner walls 404 of the tumbler reactor 400. The fins 402 are of any suitable size, shape or distribution and are configured to provide control and/or distribution of the powder motion in the tumbler reactor, particularly during injection of process gases. The fins 402 are configured to prevent the graphite or carbon-based powder from slipping along or clinging to the walls during rotation of the tumbler reactor. The fins may also assist in lifting the loaded graphite powders as the tumbler reactor rotates. In some embodiments, the fins 402 are an elongated lip that projects from the surface of the inner wall. The height of the fins 402 may vary depending on the type of graphite powder used, among other factors. In some embodiments, the height of the fins 402 are in the range of about 0.05 to 50 mm. The height of each of the fins 402 may be uniform, alternatively the height of one or more of the fins 402 may vary.

The fins 402 may have a rectangular shape as shown in FIG. 4A, or a triangular shape as shown in FIG. 4B, among other shapes. In FIG. 4C, the fins 402 have a curved shape which assists in lifting the graphite powder as the tumbler reactor rotates. Those of ordinary skill in the art will recognize that many different shapes may be used, all within the spirit and scope of the present invention.

Figure 5:
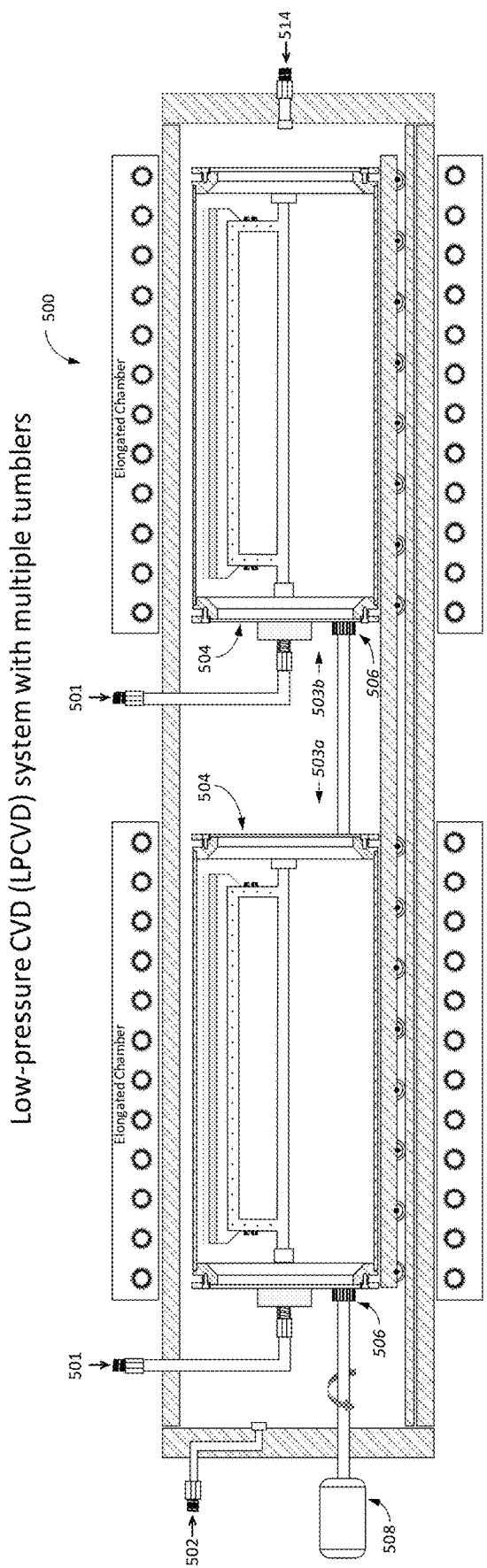
FIG. 5 depicts a cross-sectional partial view of a LPCVD system comprising two tumbler reactors, according to some embodiments of the present application.

To further increase production volume of Si nanowires, a CVD system 500 is disclosed comprised of two or more tumbler reactors 503a and 503b as illustrated in FIG. 5. In this embodiment, the tumbler reactors 503a and 503b are coupled via flanges 504, and are rotated together by a rotating gear 506 coupled to rotating electric motor 508. Alternatively, the tumbler reactors 503a and 503b may be independent. Process gas (in this example silane or silane with a mixture with other gases, such as $N_2$, Ar, $H_2$ or He) is injected into each of the tumbler reactors independently through ports 501.

The process of operation is now described with reference to FIG. 6. In operation, the tumbler reactor rotates inside the process tube and CVD chamber and mixes pre-treated graphite powder loaded in the tumbler reactor while a process gas such as silane ($SiH_4$) is injected into the tumbler reactor under controlled pressure and temperature to ensure the proper condition to grow Si nanowires on the graphite powder.

Figure 6:
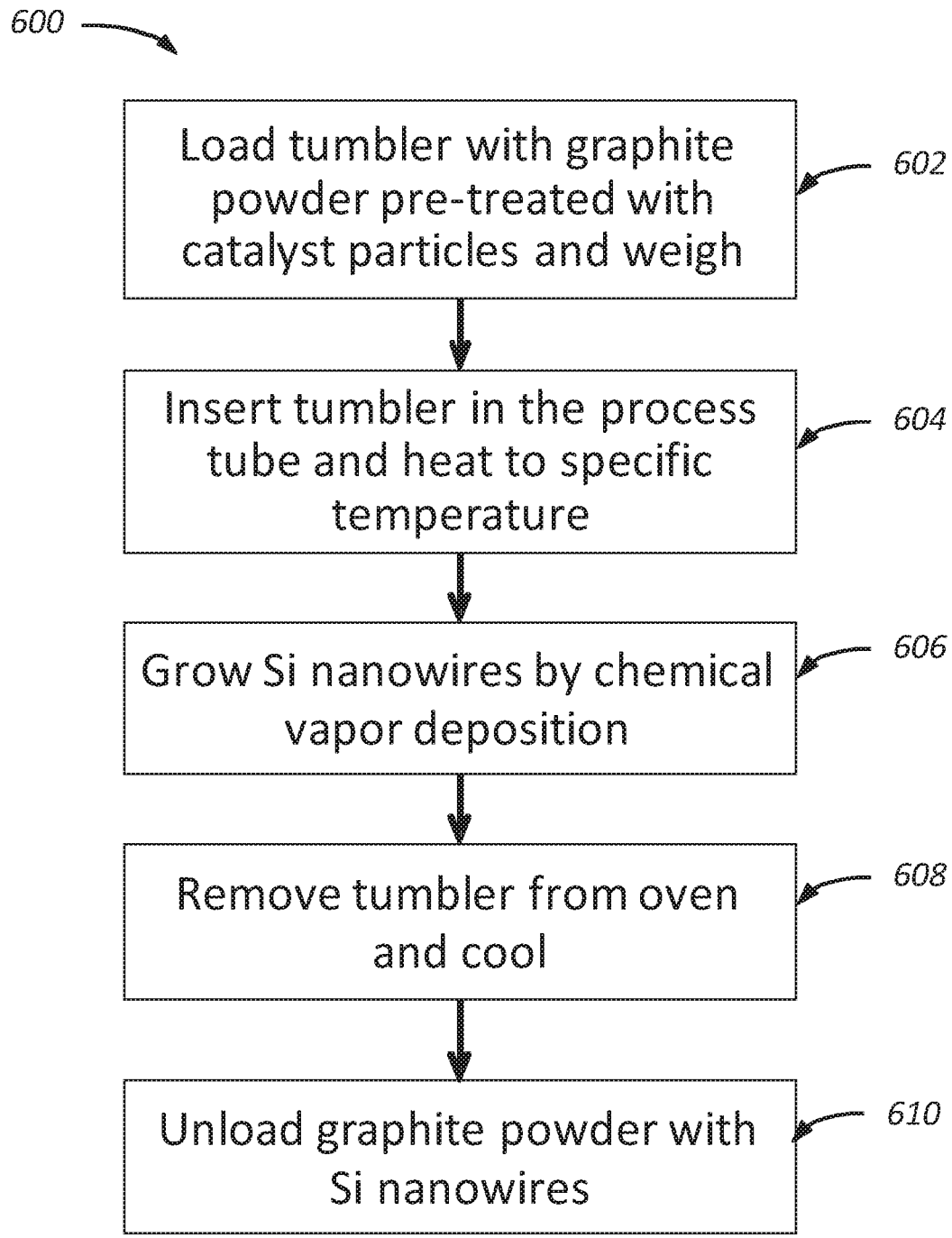
FIG. 6 is a process flow diagram illustrating a method of making the Si nanowires, according to some embodiments of the present application.

FIG. 6 illustrates a high-level process flow diagram 600 overview of the manufacturing process to Si nanowires according to embodiments of the present application. The tumbler reactor is loaded with graphite or carbon powder pre-treated with catalyst particles (Au or Cu or Cu oxides) deposited on it, and weighed at step 602. The tumbler reactor is inserted into the process tube and CVD chamber where the tumbler reactor and process tube are heated to a specific temperature at step 604. Si nanowires are grown by chemical vapor deposition at step 606. After silicon nanowire growth, the tumbler is removed from the CVD chamber and cooled at step 608. The formed graphite powder with Si nanowires is unloaded at step 610.

Figure 7:
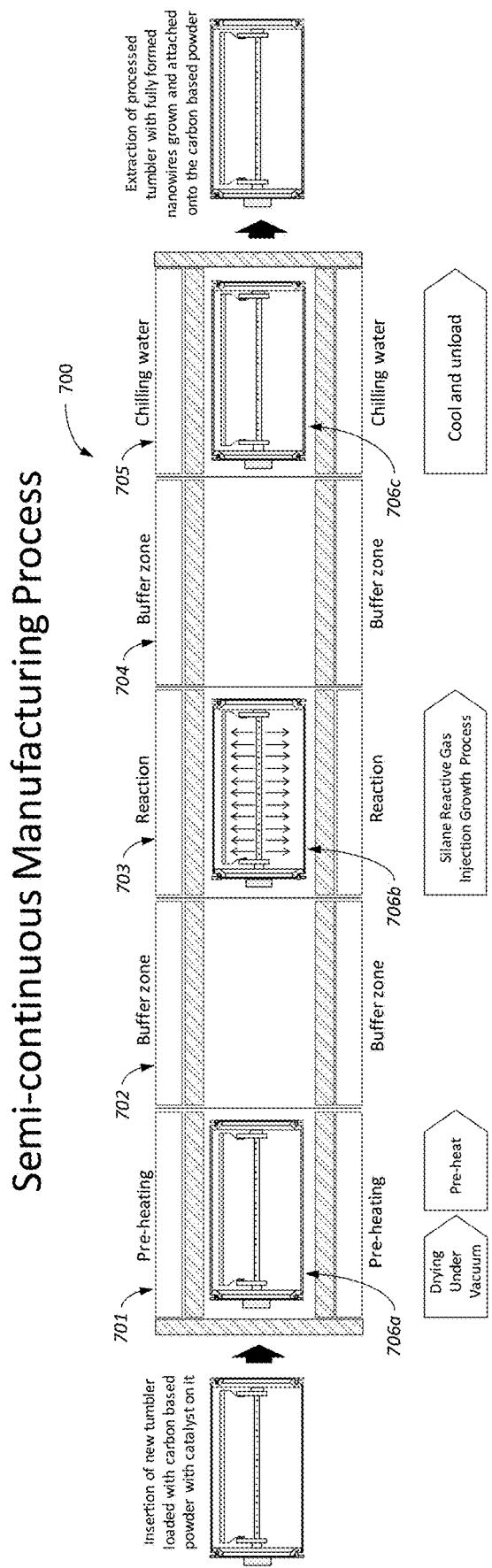
FIG. 7 is a cross-sectional partial view of an alternative embodiment of a LPCVD system configured for a semi-continuous manufacturing process, according to some embodiments of the present application.

FIG. 7 illustrates a cross-sectional partial view of an alternative embodiment of a LPCVD system 700 wherein three tumblers 706a, 706b and 706c are processed in a semi-continuous manufacturing process. Each tumbler reactor is loaded with graphite powders with catalysts deposited on the graphite and the tumbler reactor is inserted on one end of the LPCVD system and extracted on the opposite end of the LPCVD system after being processed through a sequence of three active zones, comprised of a heating zone 701, a reaction zone 703, and a cooling zone 705. The three active zones are separated from each other by two buffer zones 702 and 704 which allow the transition of each tumbler from an active zone to the next under controlled conditions of pressure and temperature. In the pre-heating zone 701, the tumbler 706a is heated to reach specific temperature and pressure conditions before moving to the reaction zone 703 through the buffer zone 702. Every time a tumbler moves from one active zone to the next, a new tumbler loaded with carbon based powder with catalyst on it is inserted into the pre-heating zone to start the process again, and a tumbler with fully formed nanowires grown and attached onto the carbon-based powder is extracted from the cooling zone with the end product ready to be unloaded. This configuration ensures a semi-continuous manufacturing process where three tumblers are always present in each of the three active zones 701, 703 and 705 at any moment in time. The advantage of this configuration is that the reaction zone 703 is continuously growing nanowires in a tumbler with no interruption, except for the periodic transition of the tumblers from one active zone to the next. The configuration can be expanded to include N active zones separated from each other through N-1 buffer zones, where N is greater than 3.

Figure 8:
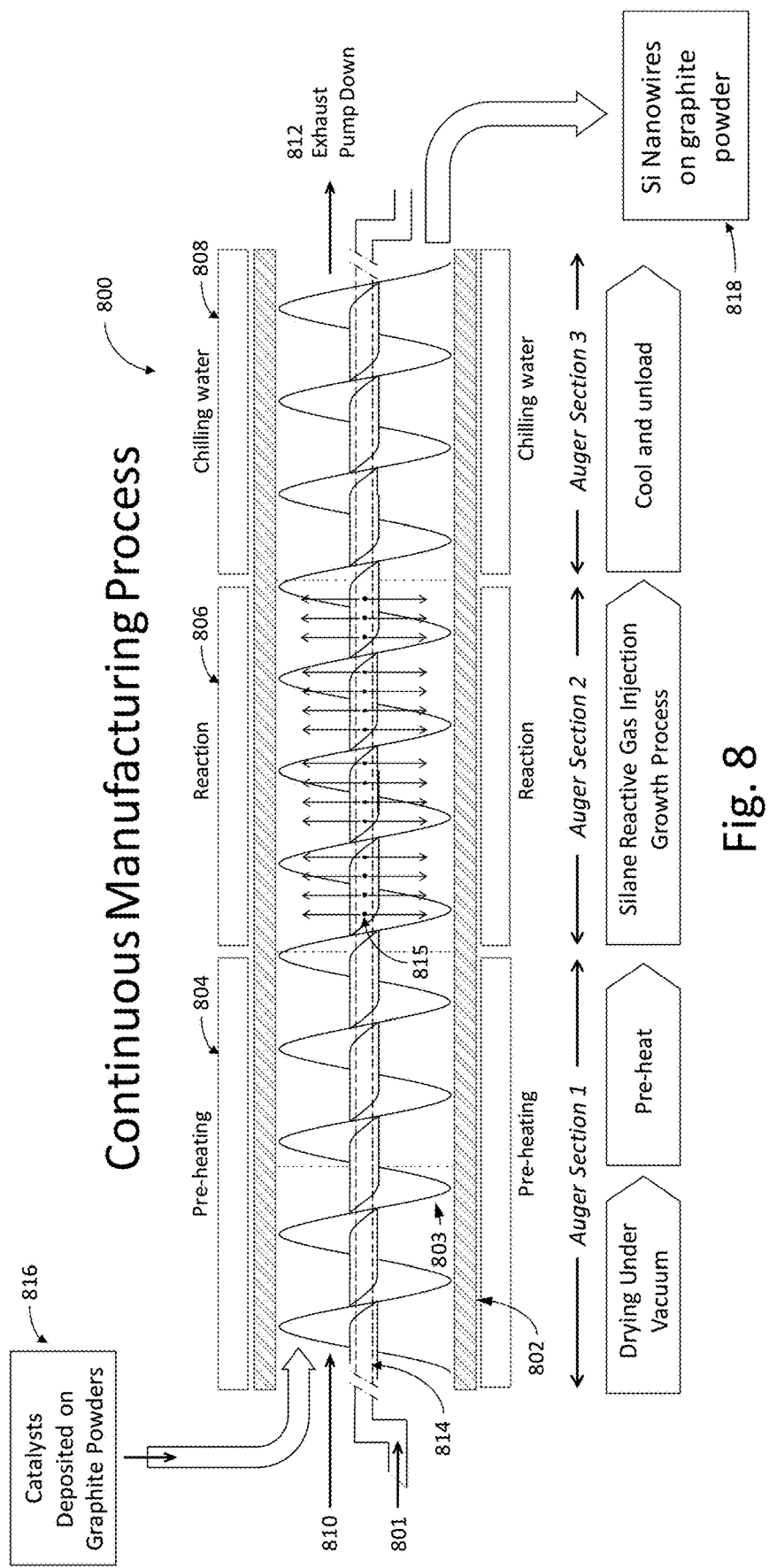
FIG. 8 is a cross-sectional partial view of an alternative embodiment of a LPCVD system having a helicoidal chamber configured for a continuous manufacturing process, according to some embodiments of the present application.

FIG. 8 illustrates a cross sectional partial view of an alternative embodiment of a LPCVD system 800 wherein the tumbler reactor comprises a helicoidal chamber 802 configured for continuous manufacturing process. In a helicoidal configuration, a rotating helix or auger pushes the substrate powder material forward through a sequence of one or more heating zones, reaction zones and cooling zones where the injection of process gases is directed toward the reaction zones where silane is converted into silicon nanowires.

In the exemplary embodiment, LPCDV system 800 includes an elongated CVD chamber 802 which is comprised of at least one preheating zone 804, reaction zone 806 and cooling zone 808, and a gas manifold 801 for injecting process gases (and optionally other gases) into CVD chamber 802. During operation, the chamber 802 is maintained under vacuum. Purge gas, typically nitrogen, is injected into the chamber by vacuum port 810, and an exhaust port 812 connected to a cyclone (not shown) is provided at the output end of the chamber 802 to provide the low pressure environment.

In some embodiments, the gas manifold 801 is comprised of an elongated gas injection member 814 that extends through the substantial or entire length of the chamber 802. To deliver process gases to the reaction zone, the gas injection member 814 contains a plurality of injection ports 815 along a section of the gas injection member 814 that is positioned in the reaction zone 806. The injection of process gases in the reaction zone 806 (generally silane, optionally mixed with one or more inert gases such as nitrogen, argon, helium and/or hydrogen) convert silane into silicon nanowires grown on the graphite powder. The sections of the gas injection member 814 that are positioned in the preheating 804 and cooling zones 808 do not contain ports and thus process gases are not injected into these zones.

Graphite powder is loaded into the chamber 802 by graphite injector 816. The graphite powder has been pretreated to deposit catalysts on the graphite powder. A rotating helix or auger 803 pushes the graphite powder forward through the preheating zone 804, reaction zone 806, and cooling zone 808. The auger 803 may be integrated with the gas injection member 814, or alternatively may be separate from the gas injection member 814. When the auger 803 and gas injection member 814 are an integrated assembly, a gas conduit is formed through the center of the auger for radially distributing the gases. Optionally, a scraper as described above can be included in one or more of the zones 804, 806, 808 to minimize buildup of powder on the inner walls of the chamber 802.

In one embodiment, as the graphite powder enters the chamber 802, the graphite powder is dried under vacuum and preheated in preheating zone 804. As the graphite powder travels through the preheating zone, the graphite is heated to a specified temperate. The heated graphite powder then exits the preheating zone and enters the reaction zone. Optionally, the preheating and reaction zones may be separated by purge or isolation curtains (not shown) or other suitable means to partially or fully isolate the zones. As the heated graphite powder enters and travels through the reaction zone 806, the graphite powder mixes with the silicon-containing process gas(es) to grow silicon nanowires on the graphite powder to form a carbon-based silicon nanowire composite powder. Next, this silicon nanowire graphite powder travels through the cooling zone 808 where the powder is cooled. Once the powder (now the formed product) passes through the cooling zone 808, the powder is removed continuously from the chamber 802 via product output 818.

As described above, the graphite powder moves through the multiple zones by helical movement driven by the auger 803. Each of the zones 804, 806, 808 may require a different residence or travel time, depending on the processing step being carried out in each zone. For example, in some embodiments, preheating of the graphite powder in the preheating zone 804 may require more time than the time needed to grow the silicon nanowires in the reaction zone 806. In such instance, control of the residence or travel time though a particular zone is achieved by varying the pitch of the auger 803 in that zone, as represented in FIG. 8 which shows three auger sections 1, 2 and 3. For example, the pitch of the auger may be adjusted to be narrower or wider, depending on the need. Thus, the speed of travel of the graphite powder through each zone may be selectively tuned. While the three auger sections illustrated in FIG. 8 are similar in length, this is solely for simplicity and it will be understood that the length of the various auger sections may vary according to the teaching of the present invention. In another embodiment, a semi-continuous batch system and process are provided, which enable multiple tumbler reactors to be processed in a semi-continuous manner. In one exemplary embodiment, the process tube is elongated and configured to accommodate four tumbler reactors for example, with heating, reaction (growing) and cooling zones such that multiple tumbler reactors may undergo processing and move from zone to zone through the process tube, which allows tumblers to be loaded and unloaded at each end of the process tube in a semi-continuous manner.

In some embodiments, the methods, systems and reactors uses to produce the carbon-based silicon nanowire composite powders describe above, are further processed to form an anode. In some embodiments, the anode is formed by coating an electrode foil with the carbon-based silicon nanowire composite powders according to coating techniques known in the art. In another embodiment, the anode is further combined with a cathode, a separator and an electrolyte to form a lithium ion battery.

The combination of lower cost catalyst nanoparticles with lower cost graphite substrate powder in a large CVD volume process enabling the growth of silicon nanowires with statistically-controlled radius and length dimensions with a very high conversion ratio and yield has been disclosed herein, enabling both high performance high energy density active anode material to be produced in large quantities at an attractive manufacturing cost.

The apparatus and methods described herein provide significant advantages over prior manufacturing techniques, and the increased production volume provided by the apparatus and system of the present application will help enable and promote the widespread adoption of Si nanowires grown on graphite or other carbon powders as anode materials in the battery industry.

While specific embodiments of the invention have been described above, it will be appreciated that the invention may be practiced otherwise than as described. The descriptions above are intended to be illustrative, and not limiting. Thus, it will be apparent to one skilled in the art that modifications may be made to the invention as described without departing from the scope of the claims set out below.

We claim:

1. A manufacturing apparatus for growing silicon nanowires on carbon based powders, comprising:
an elongated CVD chamber;
an elongated metal process tube positioned within the CVD chamber;
one or more tumbler reactors removably positioned within the elongated metal process tube and configured to rotate within the elongated metal process tube, said one or more tumbler reactors configured to receive the carbon based powder, said one or more tumbler reactors each comprising an elongated cylindrical metal tube and each having a gas distribution manifold positioned therein and extending the substantial length of the tumbler reactor;
one or more scrapers configured to scrape at least a portion of the inner walls of the one or more tumbler reactors;
wherein the elongated metal process tube and the one or more tumbler reactors positioned within the elongated metal process tube are configured to be heated according to a process recipe,
wherein the elongated metal process tube comprises a vacuum port for injecting purge gases and an exhaust port connected to a vacuum pump to provide a low pressure environment,
wherein the gas distribution manifold comprises a U-shaped gas injection member comprising a plurality of injection ports positioned along the gas injection members for injecting a mixture of process gases uniformly into the tumbler reactor, the one or more scrapers being attached to the gas injection member, and
wherein the one or more tumbler reactors each comprise an end plate at both ends of the tumbler reactor.

2. The manufacturing apparatus of claim 1 wherein the injection ports are substantially equally distributed along the gas injection member to provide substantially uniform distribution of the mixture of process gases within the one or more tumbler reactors.

3. The manufacturing apparatus of claim 1, wherein the one or more scrapers is positioned at one or more of the ends of the one or more tumbler reactors to scrape the powder from the periphery of the one or more tumbler reactors.

4. The manufacturing apparatus of claim 1 wherein the one or more scrapers comprises an elongated blade that extends at least a portion of the length of the one or more tumbler reactors.

5. The manufacturing apparatus of claim 1 wherein a brush member is positioned along at least a portion of the outer side of the elongated blade.

6. The manufacturing apparatus of claim 1, wherein the one or more scrapers is integrated with the gas distribution manifold in the one or more tumbler reactors.

7. The manufacturing apparatus of claim 1 wherein the one or more tumbler reactors further comprises one or more fins mounted on one or more inner walls of the one or more tumbler reactors.

8. The manufacturing apparatus of claim 7, wherein the one or more fins are configured to provide control of movement of the carbon-based powder in the one or more tumbler reactors.

9. The manufacturing apparatus of claim 7 wherein the one or more fins are configured to prevent the carbon based powders from slipping along or clinging to the one or more inner walls during rotation of the one or more tumbler reactors.

10. The manufacturing apparatus of claim 7, wherein the one or more fins are configured to distribute the carbon-based powder in the one or more tumbler reactors.

11. The manufacturing apparatus of claim 1, further comprising a carriage rail with wheels configured to support the one or more tumbler reactors and to move the one or more tumbler reactors in and out of the elongated metal process tube.

12. The manufacturing apparatus of claim 1, further comprising a carriage rail with wheels configured to move the CVD chamber away from the elongated metal process tube and the one or more tumbler reactors.

13. The manufacturing apparatus of claim 1, wherein the carbon based powders comprise one or more selected from the group consisting of natural graphite, artificial graphite, soft carbon, hard carbon, amorphous carbon and combinations thereof.

14. The manufacturing apparatus of claim 1, wherein the elongated metal process tube further comprises a sequence of three active zones comprising a heating zone, a reaction zone and a cooling zone, wherein the three active zones are separated from each other by two buffer zones to allow the transition of each of the one or more tumbler reactors from an active zone to the next under controlled conditions of pressure and temperature.

15. The manufacturing apparatus of claim 1, wherein temperature in the one or more tumbler reactors, gases concentration in the one or more tumbler reactors, and rotation of the one or more tumbler reactors are controlled by computer with automatic software for the production.

16. The manufacturing apparatus of claim 1, wherein at least one of the end plates comprises a toothed outer edge extending the entire periphery of the end plate, said edge engaging with a rotation gear coupled with a motor to rotate the tumbler reactor.

17. The manufacturing apparatus of claim 1, wherein the gas injection member is stationary.

18. The manufacturing apparatus of claim 1, wherein the one or more tumbler reactors each further comprise a mesh end cap, each mesh end cap having a plurality of apertures sized such that the apertures contain the carbon-based powder within the tumbler reactor and allow the process gases to flow between the tumbler reactor and the metal process tube.

* * * * *